(12) United States Patent
Choung et al.

(10) Patent No.: US 11,600,670 B2
(45) Date of Patent: Mar. 7, 2023

(54) DISPLAY DEVICE HAVING INPUT SENSOR AND FABRICATING METHOD OF THE INPUT SENSOR

(71) Applicant: Samsung Display Co., Ltd., Yongin-si (KR)

(72) Inventors: Jong-Hyun Choung, Suwon-si (KR); Jaeuoon Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/444,274

(22) Filed: Aug. 2, 2021

(65) Prior Publication Data

US 2022/0123055 A1 Apr. 21, 2022

(30) Foreign Application Priority Data

Oct. 19, 2020 (KR) .................. 10-2020-0135466

(51) Int. Cl.
*H01L 27/32* (2006.01)
*G06F 3/044* (2006.01)
*G06F 3/041* (2006.01)

(52) U.S. Cl.
CPC .......... *H01L 27/323* (2013.01); *G06F 3/0443* (2019.05); *G06F 3/0446* (2019.05); *G06F 3/04164* (2019.05); *H01L 27/3276* (2013.01); *G06F 2203/04103* (2013.01); *G06F 2203/04111* (2013.01)

(58) Field of Classification Search
None
See application file for complete search history.

(56) References Cited

U.S. PATENT DOCUMENTS

| | | | |
|---|---|---|---|
| 8,829,499 B2 | 9/2014 | Ono | |
| 9,299,472 B2 | 3/2016 | Sun et al. | |
| 9,741,773 B2 * | 8/2017 | Seo | H01L 27/3262 |
| 9,870,072 B2 | 1/2018 | Lee et al. | |

(Continued)

FOREIGN PATENT DOCUMENTS

| | | | |
|---|---|---|---|
| KR | 10-2013-0022170 A | 3/2013 | |
| KR | 10-2015-0135970 A | 12/2015 | |

(Continued)

*Primary Examiner* — Duane N Taylor, Jr.
(74) *Attorney, Agent, or Firm* — Lewis Roca Rothgerber Christie LLP

(57) ABSTRACT

An input sensor of a display device includes: a sensing electrode on a base insulating layer and overlapping a sensing region; and a signal line electrically connected to the sensing electrode and overlapping the non-sensing region, and including: a first conductive layer on the base insulating layer and having a first reflectance, a first conductivity, and a first thickness; a second conductive layer having a second reflectance lower than the first reflectance, a second conductivity lower than the first conductivity, and a second thickness smaller than the first thickness, wherein the second conductive layer is on and in contact with the first conductive layer; and a third conductive layer between the base insulating layer and the first conductive layer, in contact with each of the base insulating layer and the first conductive layer, wherein the third conductive layer contains a material different from that of the second conductive layer.

14 Claims, 20 Drawing Sheets

(56) References Cited

U.S. PATENT DOCUMENTS

| | | | | |
|---|---|---|---|---|
| 10,186,569 B2 * | 1/2019 | Matsumi | ............. | H01L 27/3279 |
| 10,541,279 B2 * | 1/2020 | An | ........................ | H01L 27/323 |
| 11,301,073 B2 * | 4/2022 | Kim | ...................... | G06F 3/0446 |

FOREIGN PATENT DOCUMENTS

| | | | |
|---|---|---|---|
| KR | 10-1790861 B1 | 10/2017 |
| KR | 10-2019-0053164 A | 5/2019 |
| KR | 10-2066136 B1 | 1/2020 |

* cited by examiner

DISPLAY DEVICE HAVING INPUT SENSOR AND FABRICATING METHOD OF THE INPUT SENSOR

CROSS-REFERENCE TO RELATED APPLICATION

The present application claims priority to and the benefit of Korean Patent Application No. 10-2020-0135466, filed on Oct. 19, 2020, the entire content of which is hereby incorporated by reference.

BACKGROUND

Aspects of some embodiments of the present disclosure herein relate to a display device having an input sensor and a method of fabricating the input sensor.

Various display devices used in multimedia devices such as televisions, mobile phones, tablet computers, navigation systems, and game machines have been developed. Input devices for such display devices include a keyboard, a mouse, or the like. In addition, display devices may include an input sensor such as a panel as an input device.

The above information disclosed in this Background section is only for enhancement of understanding of the background and therefore the information discussed in this Background section does not necessarily constitute prior art.

SUMMARY

Aspects of some embodiments of the present disclosure herein relate to a display device having an input sensor and a method of fabricating the input sensor, and for example, to a display device having an input sensor with relatively reduced external light reflectance and relatively reduced wiring defects, and a method of fabricating the input sensor.

Aspects of some embodiments of the present disclosure include a display device having an input sensor with a reduced defect rate.

Aspects of some embodiments of the present disclosure include a method of fabricating an input sensor with a reduced defect rate.

According to some embodiments of the inventive concept, a display device includes: a display panel, and an input sensor including a sensing region and a non-sensing region adjacent to the sensing region. The input sensor is on the display panel. The input sensor includes a base insulating layer, a sensing electrode on the base insulating layer and overlapping the sensing region, and a signal line electrically connected to the sensing electrode and overlapping the non-sensing region. The signal line includes a first conductive layer on the base insulating layer and having a first reflectance, a first conductivity, and a first thickness. The signal line includes a second conductive layer having a second reflectance lower than the first reflectance, a second conductivity lower than the first conductivity, and a second thickness smaller than the first thickness, wherein the second conductive layer is on and in contact with the first conductive layer. The signal line includes a third conductive layer between the base insulating layer and the first conductive layer, in contact with each of the base insulating layer and the first conductive layer. The third conductive layer contains a material different from that of the second conductive layer.

According to some embodiments, the sensing electrode may include a first sensing electrode and a second sensing electrode insulated from and crossing each other. The signal line may include a first signal line connected to the first sensing electrode and a second signal line connected to the second sensing electrode. The first sensing electrode may have an integral shape, and the second sensing electrode may include a sensing pattern on the same layer as the first sensing electrode and a bridge pattern on a layer different from that of the sensing pattern. The input sensor may further include an organic layer overlapping the sensing region. The bridge pattern may be below the organic layer, the sensing pattern may be above the organic layer, and the bridge pattern may be connected to the sensing pattern through a contact hole penetrating the organic layer.

According to some embodiments, the first sensing electrode may have the same stacked structure as the signal line.

According to some embodiments, the bridge pattern may have a stacked structure different from that of the signal line.

According to some embodiments, a bonding strength of the third conductive layer to the base insulating layer may be greater than a bonding strength of the first conductive layer to the base insulating layer.

According to some embodiments, the first conductive layer may include copper, and the third conductive layer may include Indium Zinc Oxide (IZO), Indium Oxide (InO), Zinc Oxide (ZnO), or a copper alloy.

According to some embodiments, the second conductive layer may include titanium.

According to some embodiments, the display panel may include: a base layer including a display region corresponding to the sensing region and a non-display region corresponding to the non-sensing region; a transistor on the base layer and overlapping the display region; a display element overlapping the display region and electrically connected to the transistor; and a thin-film encapsulation layer on the display element. An adhesive layer may not be between the thin-film encapsulation layer and the base insulating layer.

According to some embodiments of the inventive concept, a display device includes a display panel and an input sensor on the display panel. The display panel may include a first region including a display region and a non-display region, a second region extending from the first region and bent, and a third region extending from the second region and below the first region. The input sensor may include a sensing electrode overlapping the display region and a signal line electrically connected to the sensing electrode and overlapping the first region, the second region, and the third region. The signal line may include a first portion overlapping the first region and a second portion overlapping the second region, connected to the first portion, and on a layer different from that of the first portion. The first portion may include a first conductive layer containing copper and a second conductive layer having a lower reflectance than the first conductive layer, on the first conductive layer, and in contact with the first conductive layer. The second portion may have a stacked structure different from a stacked structure of the first portion.

According to some embodiments, the first portion may further include a third conductive layer below and in contact with the first conductive layer. The third conductive layer may include Indium Zinc Oxide (IZO), Indium Oxide (InO), Zinc Oxide (ZnO), or a copper alloy.

According to some embodiments, the sensing electrode may have the same stacked structure as the first portion.

According to some embodiments, the display panel may include a display element on the display region, a transistor on the display region and electrically connected to the display element, and a data line electrically connected to the transistor and overlapping at least the first region. The second portion and the data line may have the same stacked structure.

According to some embodiments, the signal line may further include a third portion overlapping the third region, connected to the second portion, and on a layer different from that of the second portion. The transistor may include a semiconductor pattern including a first region having a first doping concentration and a second region having a second doping concentration higher than the first doping concentration, and a gate overlapping the first region. The third portion may have the same stacked structure as the gate.

According to some embodiments, the signal line may further include a third portion overlapping the third region, connected to the second portion, and on a layer different from that of the second portion.

According to some embodiments of the inventive concept, a method for fabricating an input sensor including a sensing region and a non-sensing region adjacent to the sensing region may include: forming a bridge pattern on a base insulating layer so as to overlap the sensing region; forming an intermediate insulating layer on the base insulating layer; forming a contact hole exposing the bridge pattern on the intermediate insulating layer; and forming a sensing pattern connected to the bridge pattern through the contact hole on the intermediate insulating layer. The forming of the sensing pattern may include: forming, on the intermediate insulating layer, a first preliminary conductive layer having a first reflectance, a first conductivity, and a first thickness; forming, on the first preliminary conductive layer, a second preliminary conductive layer having a second reflectance lower than the first reflectance, a second conductivity lower than the first conductivity, and a second thickness smaller than the first thickness; forming a photoresist pattern on the second preliminary conductive layer exposing a portion of the second preliminary conductive layer; dry-etching the second preliminary conductive layer exposed from the photoresist pattern to form a second conductive pattern; removing the photoresist pattern; and wet-etching the first preliminary conductive layer exposed from the second conductive pattern to form a first conductive pattern overlapping the second conductive pattern.

According to some embodiments, the second conductive pattern may contain titanium, and the first conductive pattern may contain copper.

According to some embodiments, the forming of the sensing pattern may further include forming a third preliminary conductive layer on the intermediate insulating layer prior to forming the first preliminary conductive layer. In the forming of the first conductive pattern, the third preliminary conductive layer may be wet-etched into a third conductive pattern overlapping the first conductive pattern.

According to some embodiments, the third preliminary conductive layer may contain Indium Zinc Oxide (IZO), Indium Oxide (InO), Zinc Oxide (ZnO), or a copper alloy.

According to some embodiments, forming a signal line electrically connected to the sensing pattern in the non-sensing region on the base insulating layer may be further included. The forming of the signal line may be performed through a same step or processing operation as the forming of the sensing pattern.

According to some embodiments, the bridge pattern and the sensing pattern may have a different stacked structure from each other.

BRIEF DESCRIPTION OF THE FIGURES

The accompanying drawings are included to provide a further understanding of the inventive concept, and are incorporated in and constitute a part of this specification. The drawings illustrate aspects of some embodiments of the inventive concept and, together with the description, serve to explain principles of the inventive concept. In the drawings.

DETAILED DESCRIPTION

Figure 1A:
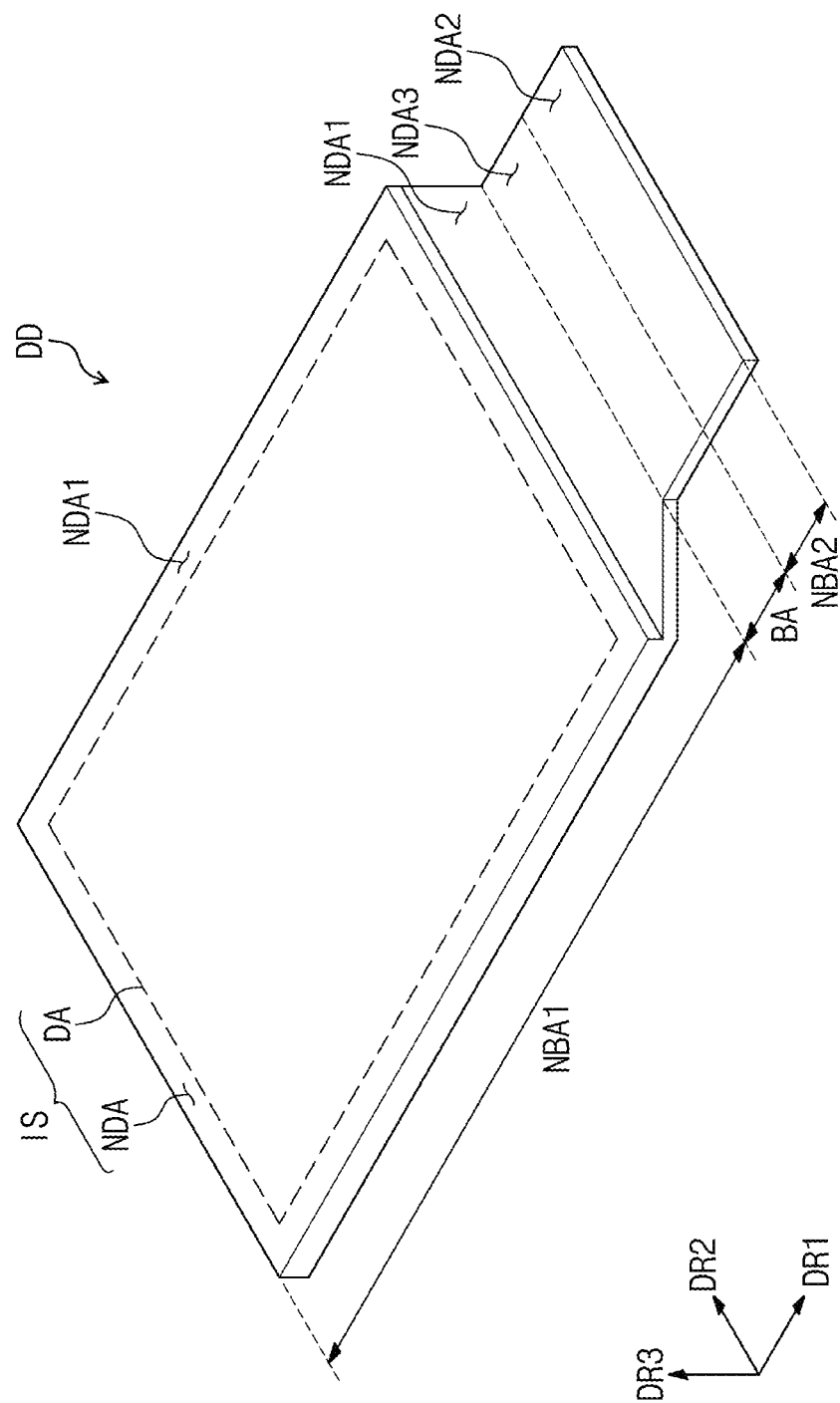
FIGS. 1A and 1B are perspective views of a display device according to some embodiments of the inventive concept.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like reference numerals refer to like elements throughout. Besides, the thicknesses and the ratios and the dimensions of elements in the drawings are exaggerated for effective description of the technical contents. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element could be termed a second element without departing from the scope of rights of the present invention. Similarly, a second element could be termed a first element. As used herein, the singular forms are intended to include the plural forms as well, unless the context clearly indicates otherwise.

Besides, spatially relative terms, such as "below", "lower", "above", "upper" and the like, may be used herein for ease of description to describe one element or feature's relationship to another element(s) or feature(s) as illustrated in the figures. The terms used herein are relative concepts and described on the basis of directions in the drawings.

It will be further understood that the terms "includes" and/or "including", when used in this specification, specify the presence of stated features, integers, steps, operations, elements, components, and/or groups thereof, but do not preclude the possibility of the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the embodiments of the present invention will be explained with reference to the accompanying drawings.

Figure 1B:
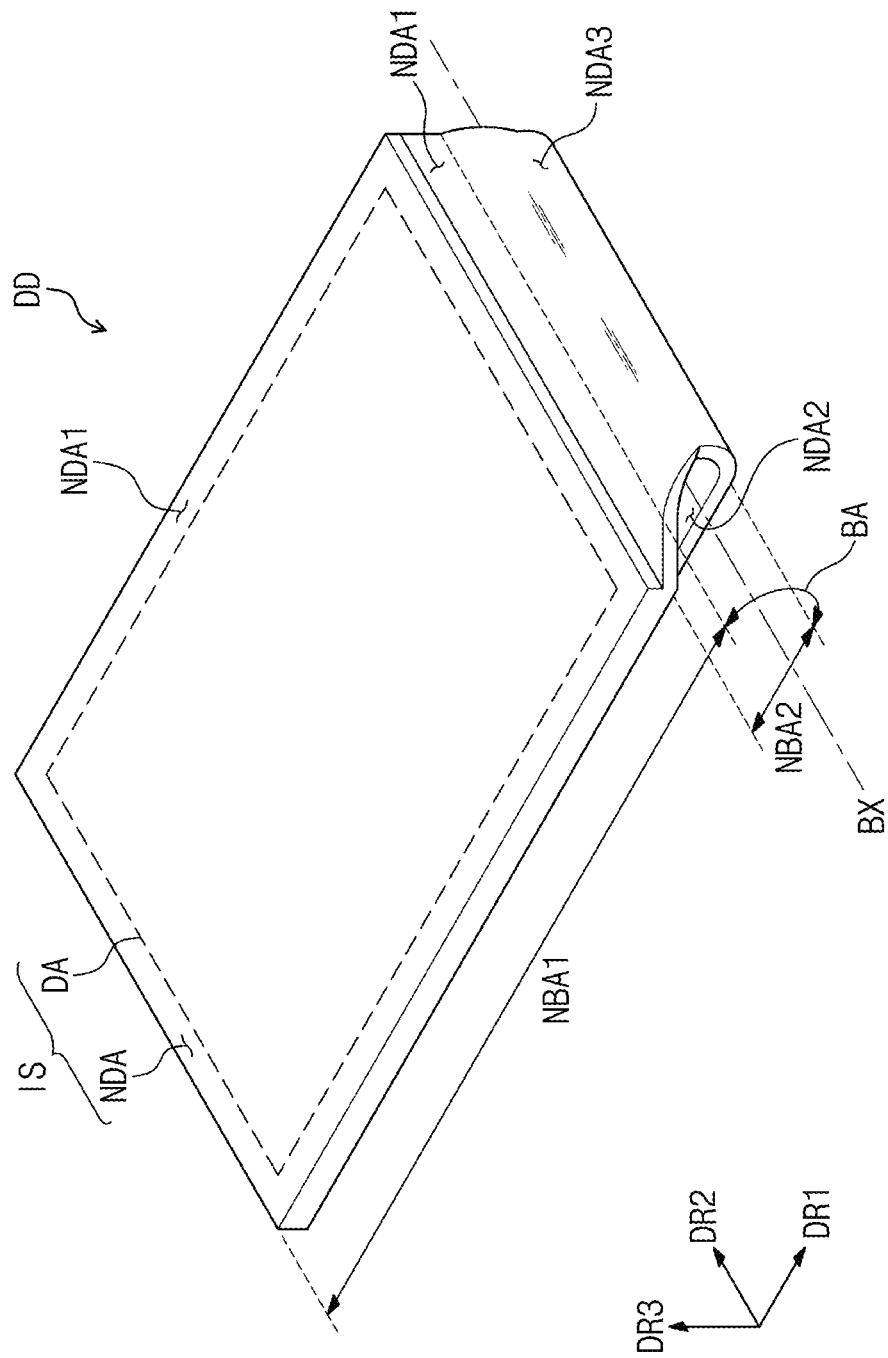
Figure 2:
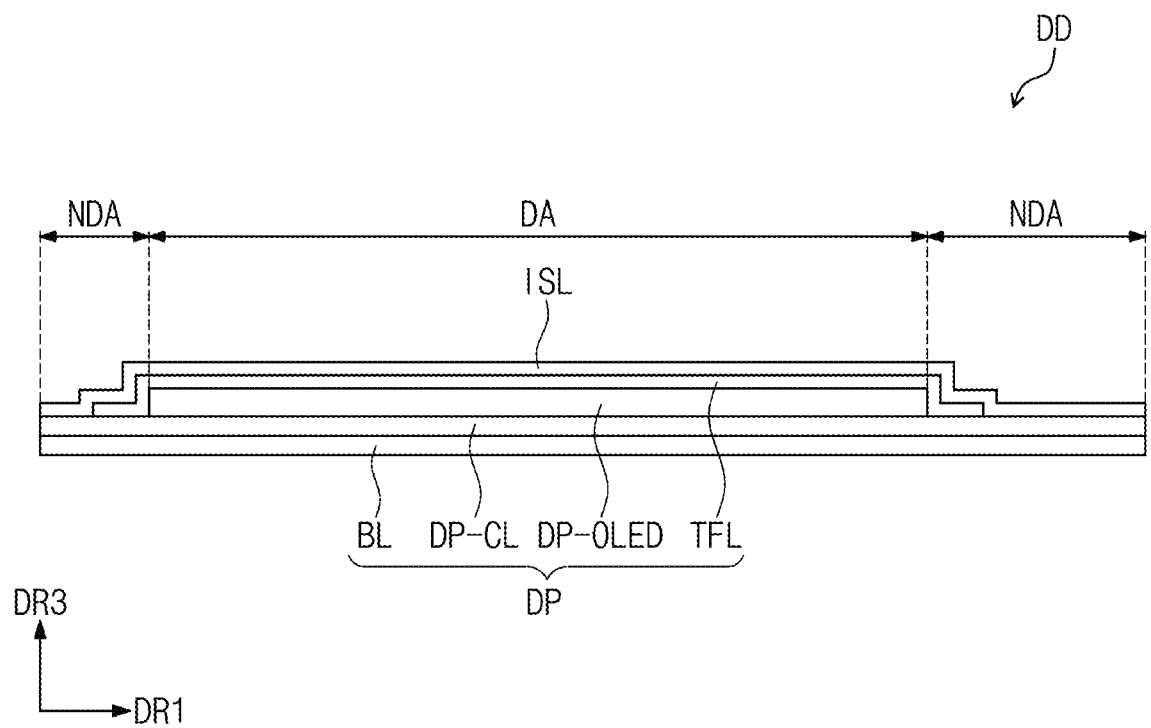
FIG. 2 is a cross-sectional view of a display device according to some embodiments of the inventive concept.

FIGS. 1A and 1B are perspective views of a display device DD according to some embodiments of the inventive concept. FIG. 2 is a cross-sectional view of a display device DD according to some embodiments of the inventive concept.

As illustrated in FIGS. 1A and 1B, a display surface IS on which an image is displayed is parallel to a plane defined by first and second direction axes DR1 and DR2. A direction that is normal or perpendicular to the display surface IS, that is, the thickness direction of the display device DD, is indicated by a third direction axis DR3. The front surface (or upper surface) and the rear surface (or lower surface) of each member are divided by the third direction axis DR3. However, the directions indicated by the first to third direction axes DR1, DR2, and DR3 are a relative concept and may be defined differently from those illustrated. Hereinafter, the first to third directions refer to the same reference numerals as directions indicated by the first to third direction axes DR1, DR2, and DR3, respectively.

The display device DD according to some embodiments may be a flexible display module. However, without being limited thereto, a display module according to some embodiments of the inventive concept may be a flat rigid display device DD. The display device DD according to some embodiments may be used not only for a large-sized electronic device such as a television, and a monitor, but also for a small and medium-sized electronic device such as a mobile phone, a tablet, a car navigation system, a game machine, and a smart watch.

As illustrated in FIGS. 1A and 1B, the display device DD includes a display region DA at which images are displayed and a non-display region NDA adjacent to the display region DA. The non-display region NDA is a region at which images are not displayed (e.g., a bezel region). For example, the display region DA may have a tetragonal shape. The non-display region NDA may surround the display region DA. However, without being limited thereto, the shapes of the display region DA and the non-display region NDA may be changed. For example, the non-display region NDA may be arranged so as to be adjacent to a portion of the display region DA.

According to some embodiments, a partial region of the display device DD may be bent. The display device DD includes a first non-bending region NBA1 (or a first region), a second non-bending region NBA2 (or a third region) spaced apart from the first non-bending region NBA1 in the first direction DR1, and a bending region BA (or a second region) defined between the first non-bending region NBA1 and the second non-bending region NBA2. The first non-bending region NBA1 may include the display region DA and a portion of the non-display region (hereinafter, a first non-display region NDA1). The non-display region NDA may include a portion (hereinafter, a second non-display region NDA2) corresponding to the second non-bending region NBA2 and a portion (hereinafter, a third non-display region NDA3) corresponding to the bending region BA.

The bending region BA may be bent along a bending axis BX defined in the second direction DR2. The second non-bending region NBA2 faces the first non-bending region NBA1. The bending region BA and the second non-bending region NBA2 may have a width in the second direction DR2, which is smaller than the first non-bending region NBA1.

The above-described definitions of the display region DA, the non-display region NDA, the first non-bending region NBA1, the second non-bending region NBA2, and the bending region BA may be equally applied to each of the display panel DP and the input sensor ISL, which are the components of the display device DD.

FIG. 2 is a cross-sectional view of a display device according to some embodiments of the inventive concept. FIG. 2 illustrates a cross section defined by the first direction axis DR1 and the third direction axis DR3.

As illustrated in FIG. 2, the display device DD includes a display panel DP and an input sensor ISL. According to some embodiments, the display device DD may further include a protective member located on the lower surface of the display panel DP, a reflection prevention member located on the upper surface of the input sensor ISL, and/or a window member.

The display panel may be a light-emitting display panel, and is not particularly limited. For example, the display panel DP may be an organic light-emitting display panel, or an inorganic light-emitting display panel. A light-emitting layer of the organic light-emitting display panel includes an organic light-emitting material. A light-emitting layer of the inorganic light-emitting display panel includes quantum dots, quantum rods, or micro LEDs. Hereinafter, the display panel DP will be described as an organic light-emitting display panel.

The display panel DP includes a base layer BL, a circuit element layer DP-CL located on the base layer BL, a display element layer DP-OLED, and an upper insulating layer TFL. The input sensor ISL may be located directly on the upper insulating layer TFL. In this specification, the expression "configuration A is located directly on configuration B" means that no adhesive layer is located between the configuration A and the configuration B.

The base layer BL may include at least one plastic film. The base layer BL may include, as a flexible substrate, a plastic substrate, a glass substrate, a metal substrate, an organic/inorganic composite material substrate, or the like. The display region DA, the non-display region NDA, the first non-bending region NBA1, the second non-bending region NBA2, and the bending region BA described with reference to FIGS. 1A and 1B may be defined identically in the base layer BL.

The circuit element layer DP-CL includes at least one insulating layer and a circuit element. The insulating layer includes at least one inorganic layer and at least one organic layer. The circuit element includes signal lines, a pixel driving circuit, and the like. Further details and characteristics of these components will be described below.

The display element layer DP-OLED includes a display element. The display element layer DP-OLED may further include an organic layer such as a pixel defining film.

The upper insulating layer TFL includes a plurality of thin films. Some thin films are arranged to improve optical efficiency, and some thin films are arranged to protect organic light-emitting diodes. Further details of the upper insulating layer TFL will be described later.

The input sensor ISL acquires the coordinate information of an external input. The input sensor ISL may have a multi-layered structure. The input sensor ISL may include a single-layered or multi-layered conductive layer. The input sensor ISL may include a single-layered or multi-layered insulating layer. The input sensor ISL may sense an external input, for example, in a capacitive manner. In embodiments according to the present disclosure, the operation manner of the input sensor ISL is not particularly limited, and according to some embodiments of the inventive concept, the input sensor ISL may sense an external input in an electromagnetic induction manner or a pressure-sensing manner.

Figure 3:
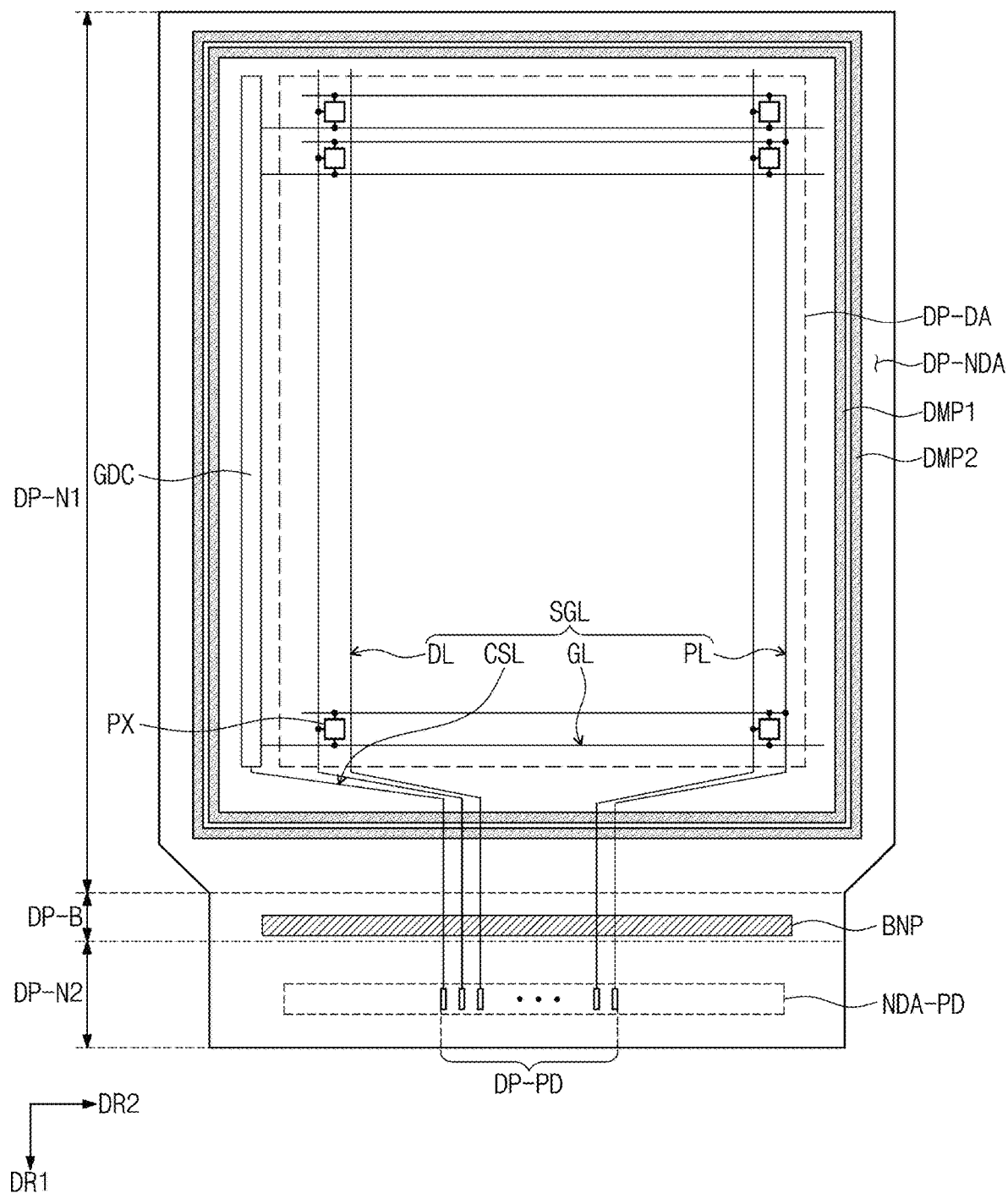
FIG. 3 is a plane view of a display panel according to some embodiments of the inventive concept.
Figure 4:
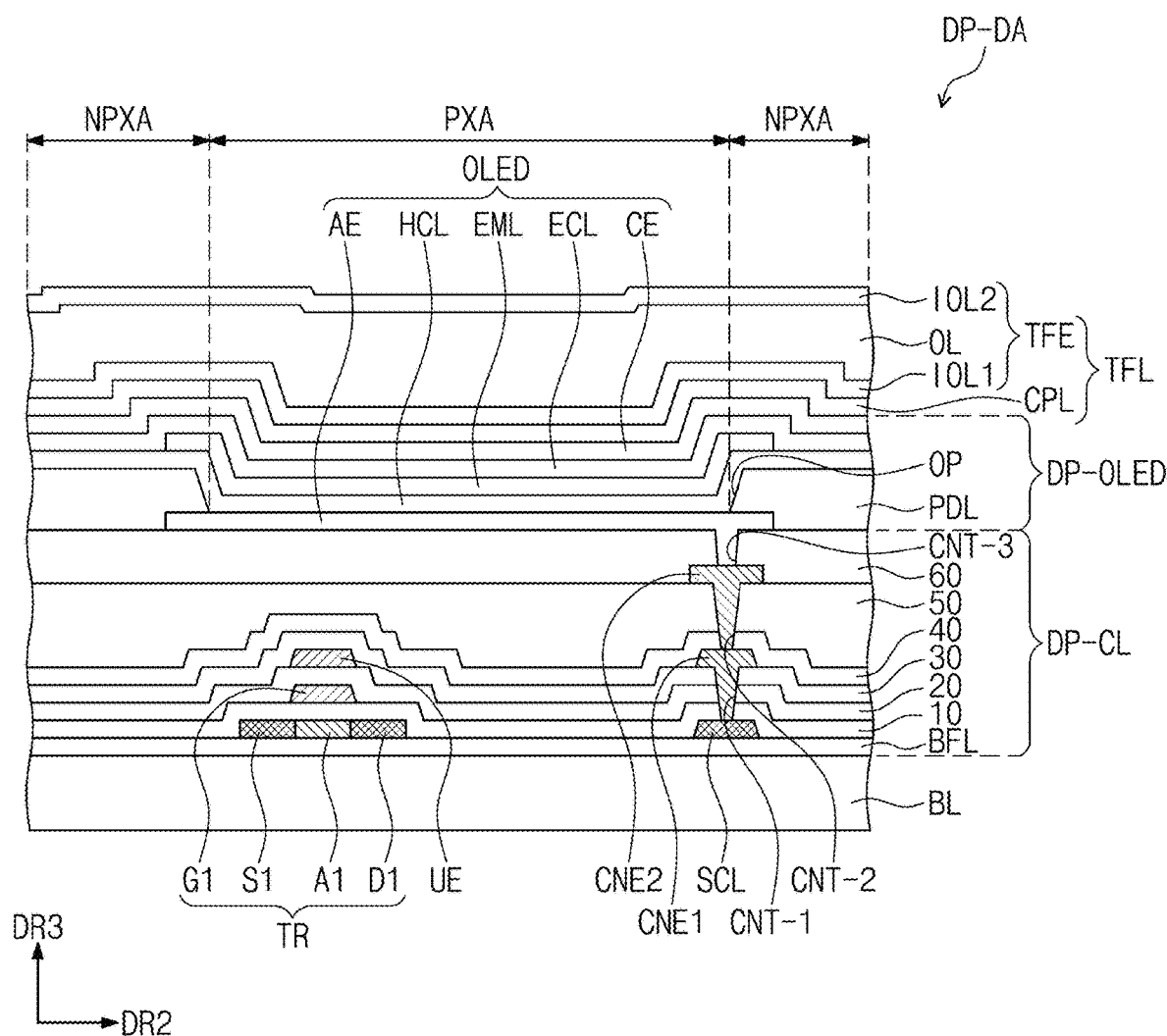
FIG. 4 is a cross-sectional view of a display panel according to some embodiments of the inventive concept.
Figure 5:
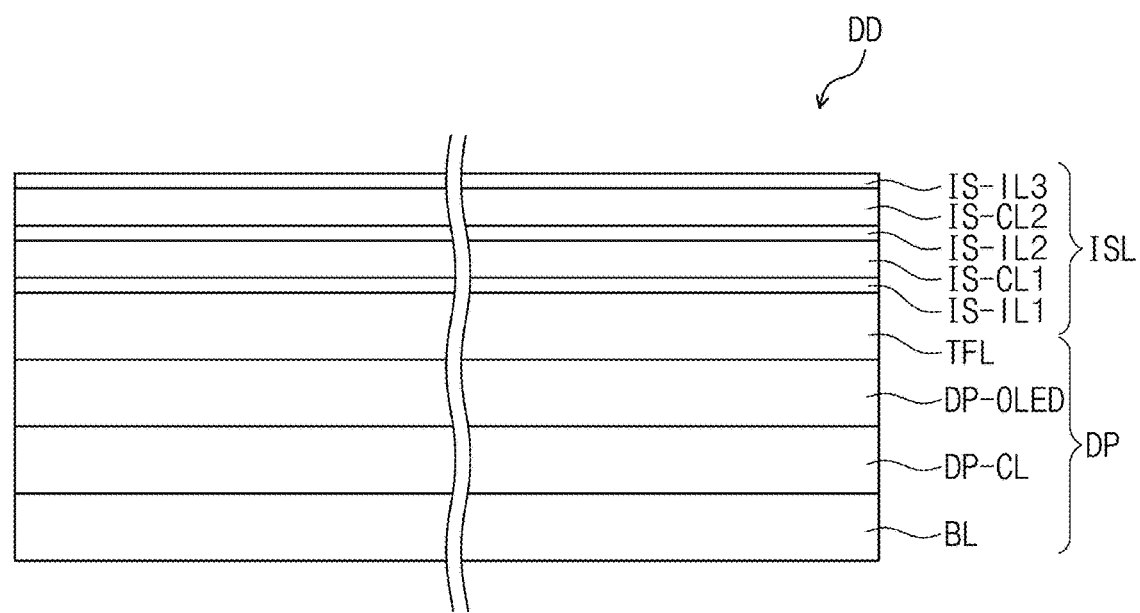
FIG. 5 is a schematic cross-sectional view of a display device according to some embodiments of the inventive concept.
Figure 5:
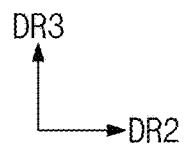

FIG. 3 is a plane view of a display panel DP according to some embodiments of the inventive concept. FIG. 4 is a cross-sectional view of a display panel DP according to some embodiments of the inventive concept. FIG. 5 is a schematic cross-sectional view of a display device DD according to some embodiments of the inventive concept.

As illustrated in FIG. 3, the display panel DP includes, on a plane, a display region DP-DA and a non-display region DP-NDA. According to some embodiments, the non-display region DP-NDA may be defined along the edge of the display region DP-DA. The display region DP-DA and the non-display region DP-NDA of the display panel DP correspond respectively to the display region DA and the non-display region NDA of the display device DD illustrated in FIGS. 1A and 1B.

The display panel DP may include a first non-bending region DP-N1, a second non-bending region DP-N2, and a bending region DP-B corresponding to the first non-bending region NBA1, the second non-bending region NBA2, and the bending region BA illustrated in FIGS. 1A and 1B. The corresponding regions of the display panel DP and the display device DD do not necessarily need to be the same, and may be changed according to the structure/design of the display panel DP.

The display panel DP may include a driving circuit GDC, a plurality of signal lines SGL, and a plurality of pixels PX. The plurality of pixels PX are arranged in the display region DP-DA. Each of the pixels PX includes an organic light-emitting diode and a pixel driving circuit connected thereto. The driving circuit GDC, the plurality of signal lines SGL, and the pixel driving circuit may be included in the circuit element layer DP-CL illustrated in FIG. 2.

The driving circuit GDC may include a scan driving circuit. The scan driving circuit GDC generates a plurality of scan signals, and sequentially outputs the plurality of scan signals to a plurality of scan lines GL to be described later. The scan driving circuit GDC may further output another control signal to the driving circuit of the pixels PX.

The scan driving circuit GDC may include a plurality of thin-film transistors formed through the same process as a process for forming the driving circuit of the pixels PX, for example, a low-temperature polycrystalline silicon (LTPS) process or a low-temperature polycrystalline oxide (LTPO) process.

The plurality of signal lines SGL include scan lines GL, data lines DL, a power line PL, and a control signal line CSL. Each of the scan lines GL is connected to a corresponding pixel PX among a plurality of pixels PX, and each of the data lines DL is connected to a corresponding pixel PX among a plurality of pixels PX. The power line PL is connected to a plurality of pixels. The control signal line CSL may provide control signals to the scan driving circuit GDC.

The display panel DP includes signal pads DP-PD connected to the ends of the signal lines SGL. A region in which the signal pads DP-PD are located among the non-display region DP-NDA may be defined as a pad region NDA-PD.

The display panel DP may include insulating patterns DMP1 and DMP2. FIG. 3 illustrates two insulating patterns DMP1 and DMP2 as an example. The two insulating patterns DMP1 and DMP2 are located in the non-display region DP-NDA and surround the display region DP-DA. A portion of the two insulating patterns DMP1 and DMP2 may be parallel to the pad region NDA-PD. Each of the two insulating patterns DMP1 and DMP2 may have a closed line shape. The insulating patterns DMP1 and DMP2 serve as a dam for preventing or reducing instances of a liquid organic matter overflowing in an inkjet process of the display panel DP.

The display panel DP may include a bank BNP. The bank BNP may be located between the display region DP-DA and the pad region NDA-PD. The bank BNP may be parallel to a portion of the insulating patterns DMP1 and DMP2 and the pad region NDA-PD. According to some embodiments of the inventive concept, at least one of the insulating patterns DMP1 or DMP2 or the bank BNP may be omitted.

FIG. 4 illustrates a partial cross-section of the display panel DP. A circuit element layer DP-CL, a display element layer DP-OLED, and an upper insulating layer TFL are sequentially arranged on a base layer BL.

The circuit element layer DP-CL includes at least one insulating layer and a circuit element. The circuit element includes a signal line, a pixel driving circuit and the like. The circuit element layer DP-CL may be formed through a process of forming an insulating layer, a semiconductor layer and a conductive layer by coating, deposition, or the like, and a process of patterning the insulating layer, the semiconductor layer, and the conductive layer by a photolithography process and an etching process.

A buffer layer BFL may include a plurality of stacked inorganic layers. A semiconductor pattern is located on the buffer layer BFL. The buffer layer BFL improves the bonding strength between the base layer BL and the semiconductor pattern.

The semiconductor pattern may contain polysilicon. However, without being limited thereto, the semiconductor pattern may contain amorphous silicon or metal oxide. FIG. 4 illustrates only a portion of the semiconductor pattern, and the semiconductor pattern may be further located in another region of the pixel PX on a plane. The semiconductor pattern may be arranged in a specific rule across the pixels PX.

Semiconductor patterns have different electrical properties depending on whether they are doped or not. The semiconductor pattern may include a first region A1 having a low doping concentration and conductivity and second regions S1 and D1 having a relatively high doping concentration and conductivity. One second region S1 may be located at one side of the first region A1, and the other second region D1 may be located at the other side of the first region A1. The second regions S1 and D1 may be doped with an N-type dopant or a P-type dopant. A P-type transistor includes a doped region doped with a P-type dopant. The first region A1 may be a non-doped region or may be doped with a lower concentration than that of the second regions S1 and D1.

The second regions S1 and D1 substantially serve as an electrode or a signal line. One second region S1 may correspond to a source of a transistor, and one second region D1 may be a drain. FIG. 4 illustrates a portion of a connection signal line SCL formed from the semiconductor pattern. According to some embodiments, the connection signal line SCL may be connected to the drain of the transistor TR on a plane.

A first insulating layer 10 is located on the buffer layer BFL. The first insulating layer 10 overlaps a plurality of pixels PX (see FIG. 3) in common and covers the semiconductor pattern. The first insulating layer 10 may be an inorganic layer and/or an organic layer and have a single-layered or multi-layered structure. The first insulating layer 10 may include at least one of aluminum oxide, titanium oxide, silicon oxide, silicon oxynitride, zirconium oxide, or hafnium oxide. In addition to the first insulating layer 10, the insulating layer of the circuit element layer DP-CL to be described later may be an inorganic layer and/or an organic layer and have a single-layered or multi-layered structure.

A gate G1 is located on the first insulating layer 10. The gate G1 may include a multi-layered metal layer. The gate G1 overlaps the first region A1. In the process of doping the semiconductor pattern, the gate G1 is the same as the mask.

A second insulating layer 20 covering the gate G1 is located on the first insulating layer 10. The second insulating layer 20 overlaps pixels PX (see FIG. 3) in common. An upper electrode UE may be located on the second insulating layer 20. The upper electrode UE may overlap the gate G1. The upper electrode UE may include a multi-layered metal layer. According to some embodiments of the inventive concept, the upper electrode UE may be omitted.

A third insulating layer 30 covering the upper electrode UE is located on the second insulating layer 20. A first connection electrode CNE1 may be located on the third insulating layer. The first connection electrode CNE1 may be connected to the connection signal line SCL through a contact hole CNT-1 penetrating the first to third insulating layers 10 to 30.

A fourth insulating layer 40 is located on the third insulating layer 30. A fifth insulating layer 50 is located on the fourth insulating layer 40. The fifth insulating layer 50 may be an organic layer. A second connection electrode CNE2 may be located on the fifth insulating layer 50. The second connection electrode CNE2 may be connected to the first connection electrode CNE1 through a contact hole CNT-2 penetrating the fourth insulating layer 40 and the fifth insulating layer 50.

A sixth insulating layer 60 covering the second connection electrode CNE2 is located on the fifth insulating layer 50. The sixth insulating layer 60 may be an organic layer. An organic light-emitting diode OLED, which is a display element, is located on the sixth insulating layer 60.

A first electrode AE (or anode) is located on the sixth insulating layer 60. The first electrode AE is connected to the second connection electrode CNE2 through a contact hole CNT-3 penetrating the sixth insulating layer 60. An opening OP is defined in a pixel defining film PDL. The opening OP of the pixel defining film PDL exposes at least a portion of the first electrode AE. The pixel defining film PDL may be an organic layer.

As illustrated in FIG. 4, the display region DP-DA may include a light-emitting region PXA and a non-light-emitting region NPXA adjacent to the light-emitting region PXA. The non-light-emitting region NPXA may surround the light-emitting region PXA. According to some embodiments, the light-emitting region PXA is defined to correspond to a partial region of the first electrode AE exposed by the opening OP.

A hole control layer HCL may be commonly arranged in the light-emitting region PXA and the non-light-emitting region NPXA. The hole control layer HCL may include a hole transport layer and further include a hole injection layer. A light-emitting layer EML is located on the hole control layer HCL. The light-emitting layer EML may be located in a region corresponding to the opening OP. That is, the light-emitting layer EML may be formed separately in each of the pixels PX (see FIG. 3).

An electronic control layer ECL is located on the light-emitting layer EML. The electronic control layer ECL may include an electric transport layer and further include an electronic injection layer. The hole control layer HCL and the electric control layer ECL may be commonly formed in a plurality of pixels by using an open mask. A second electrode CE (or cathode) is located on the electronic control layer ECL. The second electrode CE has an integral shape and is commonly arranged in a plurality of pixels PX (see FIG. 3). As illustrated in FIG. 4, an upper insulating layer TFL is located on the second electrode CE.

The upper insulating layer TFL may include a plurality of thin films. According to some embodiments, the upper insulating layer TFL may include a capping layer CPL and a thin-film encapsulation layer TFE located on the capping layer CPL. The capping layer CPL is located on and in contact with the second electrode CE. The capping layer CPL may contain an organic material.

The thin-film encapsulation layer TFE may include a first inorganic layer IOL1, an organic layer OL, and a second inorganic layer IOL2. The first inorganic layer IOL1 and the second inorganic layer IOL2 protect the display element layer DP-OLED from moisture/oxygen, and the organic layer OL protects the display element layer DP-OLED from foreign substances such as dust particles.

As illustrated in FIG. 5, the input sensor ISL may include a first insulating layer IS-IL1 (hereinafter, a base insulating layer), a first conductive pattern layer IS-CL1, an intermediate insulating layer IS-IL2 (hereinafter, an intermediate insulating layer), a second conductive pattern layer IS-CL2, and a third insulating layer IS-IL3 (hereinafter, a protective insulating layer). The base insulating layer IS-IL1 may be located directly on the upper insulating layer TFL. According to some embodiments of the inventive concept, the base insulating layer IS-IL1 and/or the protective insulating layer IS-IL3 may be omitted. When the base insulating layer IS-IL1 is omitted, the upper insulating layer TFL may correspond to the base insulating layer. The protective insulating layer IS-IL3 may be replaced with an adhesive layer that bonds an upper member located on the input sensor ISL.

Each of the first conductive pattern layer IS-CL1 and the second conductive pattern layer IS-CL2 may include a plurality of conductive patterns. The conductive patterns may have a single-layered structure or a multi-layered structure stacked along the third direction axis DR3. The multi-layered conductive pattern may include at least two layers among transparent conductive layers and metal layers. The multi-layered conductive pattern may include metal layers containing different metals. The transparent conductive layer may contain indium tin oxide (ITO), indium zinc oxide (IZO), zinc oxide (ZnO), indium tin zinc oxide (ITZO), PEDOT, metal nanowire, and graphene. The metal layer may contain molybdenum, silver, titanium, copper, aluminum, and alloys thereof. The details of the stacked structure of each of the first conductive pattern layer IS-CL1 and the second conductive pattern layer IS-CL2 will be described later. Each of the first conductive pattern layer IS-CL1 and the second conductive pattern layer IS-CL2 includes a plurality of conductive patterns. Each of conductive patterns may include sensing electrodes and signal lines connected thereto.

According to some embodiments, each of the base insulating layer IS-IL1 and the protective insulating layer IS-IL3 may include an inorganic or organic layer. According to some embodiments, the intermediate insulating layer IS-IL2 may be an organic layer. The organic layer may contain at least one of acrylic-based resin, methacrylic-based resin, polyisoprene, vinyl-based resin, epoxy-based resin, urethane-based resin, cellulose-based resin, siloxane-based resin, polyimide-based resin, polyimide-based resin, or perylene-based resin.

According to some embodiments, the intermediate insulating layer IS-IL2 may cover a sensing region IS-DA. That is, the intermediate insulating layer IS-IL2 may be entirely overlapped in the sensing region IS-DA. According to some embodiments of the inventive concept, the intermediate insulating layer IS-IL2 may include a plurality of insulating patterns located in a non-sensing region IS-NDA.

Figure 6A:
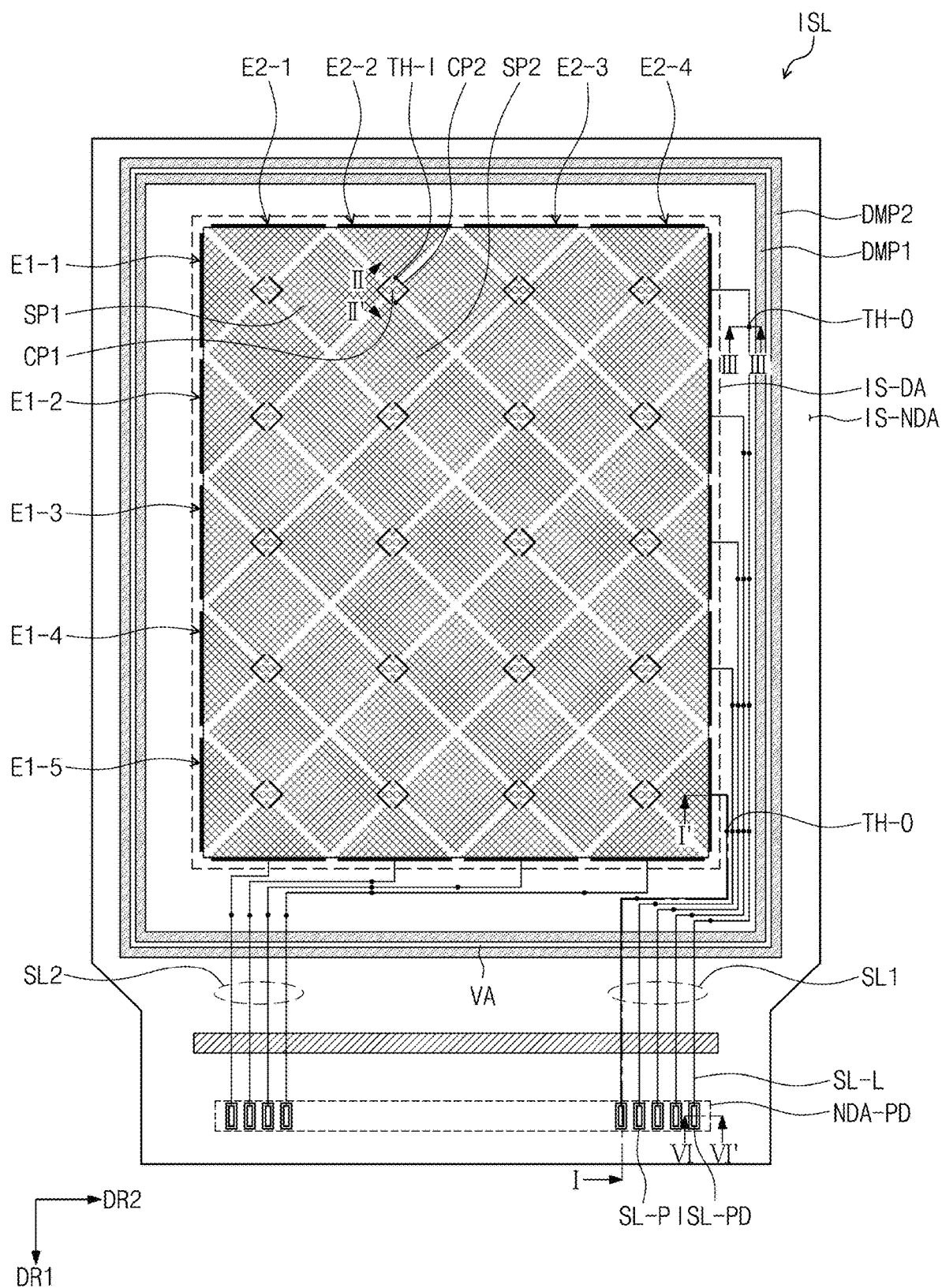
FIG. 6A is a plane view of an input sensor according to some embodiments of the inventive concept.
Figure 6B:
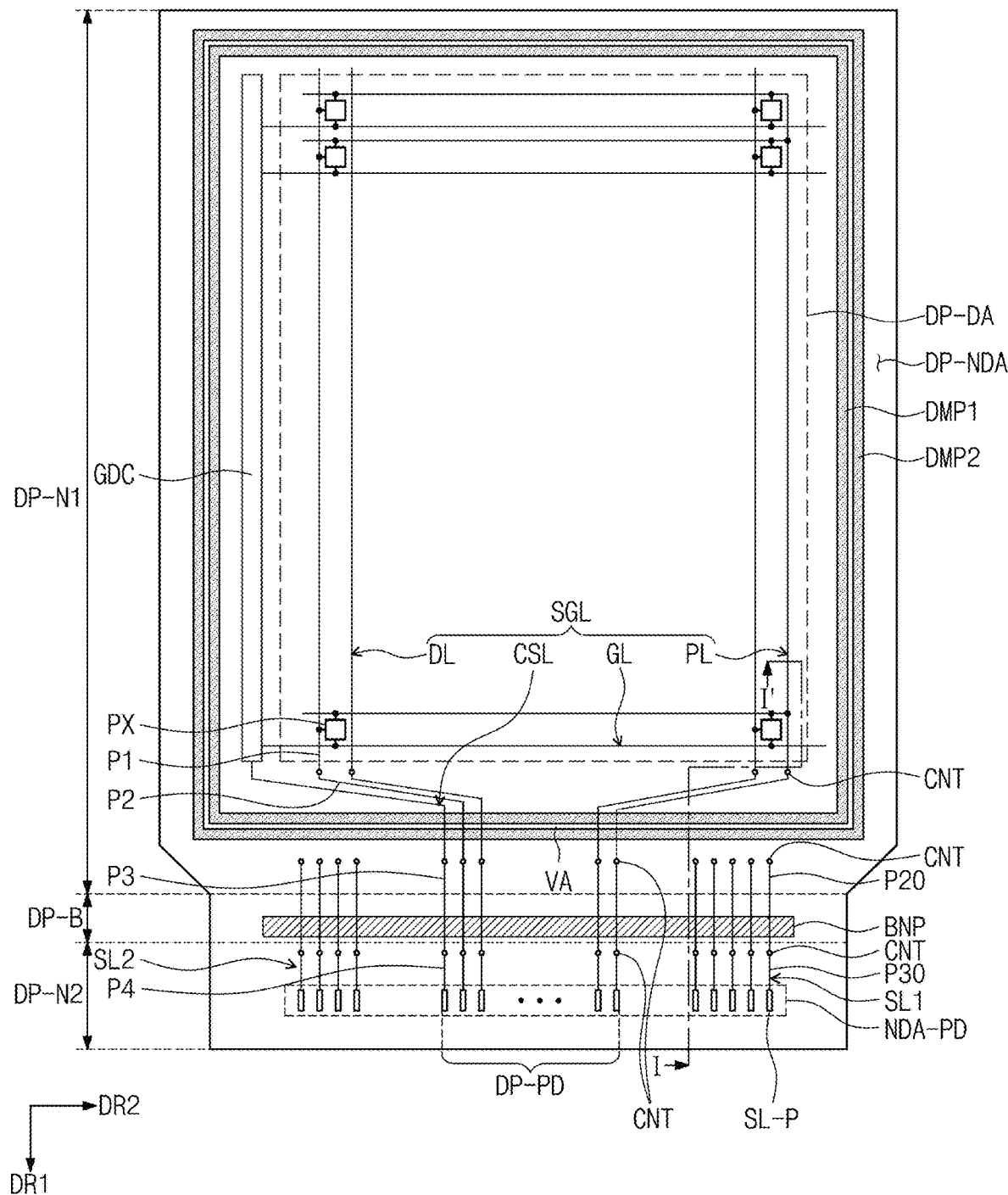
FIGS. 6B and 6C are plane views illustrating signal lines of an input sensor in detail according to some embodiments of the inventive concept.
Figure 6C:
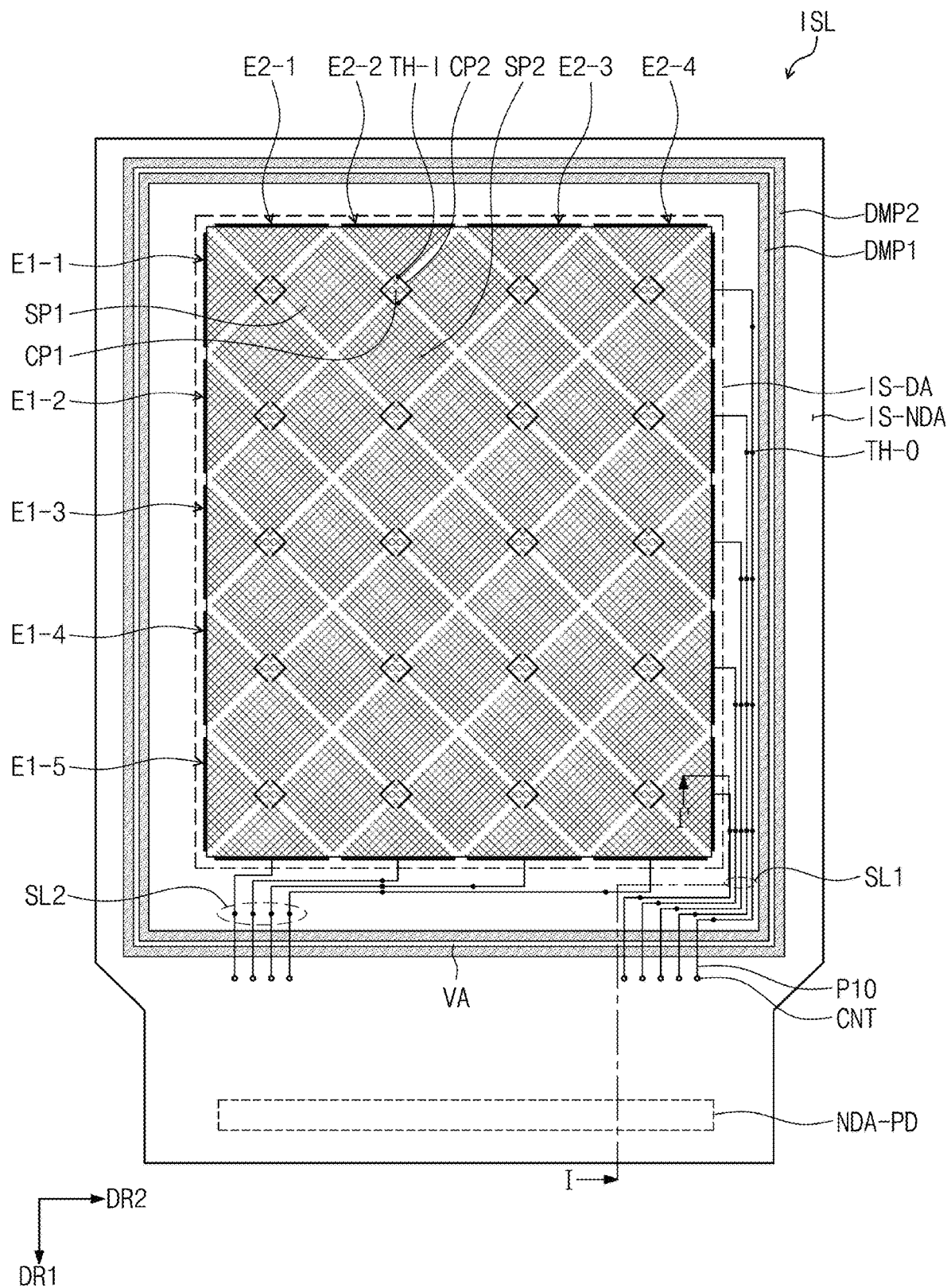

FIG. 6A is a plane view of an input sensor ISL according to some embodiments of the inventive concept. FIGS. 6B and 6C are plane views illustrating signal lines SL1 and SL2 of an input sensor ISL in detail according to some embodiments of the inventive concept.

As illustrated in FIG. 6A, the input sensor ISL includes the sensing region IS-DA and the non-sensing region IS-NDA adjacent to the sensing region IS-DA. The sensing region IS-DA and the non-sensing region IS-NDA correspond, respectively, to the display region DP-DA and the non-display region DP-NDA illustrated in FIG. 3.

The first electrodes E1-1 to E1-5 and second electrodes E2-1 to E2-4 insulated from and crossing each other are located in the sensing region IS-DA. First signal lines SL1 connected to the first electrodes E1-1 to E1-5 and second signal lines SL2 electrically connected to the second electrodes E2-1 to E2-4 are located in the non-sensing region IS-NDA. One of the first signal lines SL1 and the second signal lines SL2 transmits a transmission signal for sensing an external input from an external circuit to corresponding electrodes, and the other thereof transmits, as a received signal, a change in capacitance between the first electrodes E1-1 to E1-5 and the second electrodes E2-1 to E2-4 to an external circuit.

Each of the first signal lines SL1 and the second signal lines SL2 may include a line portion SL-L and a pad portion SL-P. Each of the first signal lines SL1 and the second signal lines SL2 may have an integral shape and include a plurality of portions connected through a contact hole penetrating an insulating layer. Some of the plurality of portions may be located on different layers. The line portion SL-L and the pad portion SL-P of the signal line having an integral shape are located on the same layer. The line portion SL-L and the pad portion SL-P may be formed by the same process to have the same stacked structure. Hereinafter, unless otherwise specified, it will be understood that if configuration A and configuration B are located on the same layer, the configurations are formed by the same process to have the same stacked structure. In addition, hereinafter, unless otherwise specified, it will be understood that if the configuration A and the configuration B are located on different layers, the configurations are formed by different processes to have different stacked structures. According to some embodiments, each of the first signal lines SL1 and the second signal lines SL2 includes a plurality of portions, and the details of this will be described later.

Each of the first electrodes E1-1 to E1-5 and the second electrodes E2-1 to E2-4 may have a mesh shape in which a plurality of openings are defined. The plurality of openings are defined to correspond to the light-emitting region of the display panel DP. The second electrodes E2-1 to E2-4 are insulated from and cross the first electrodes E1-1 to E1-5. One of the first electrodes E1-1 to E1-5 and the second electrodes E2-1 to E2-4 may have an integral shape. According to some embodiments, the first electrodes E1-1 to E1-5 having an integral shape are illustrated as an example. The first electrodes E1-1 to E1-5 may include sensing portions SP1 and intermediate portions CP1.

Each of the second electrodes E2-1 to E2-4 may include sensing patterns SP2 and bridge patterns CP2 (or connection patterns). Two adjacent sensing patterns SP2 may be connected to two bridge patterns CP2, but the number of bridge patterns is not limited.

The bridge patterns CP2 may be formed by patterning the first conductive pattern layer IS-CL1 illustrated in FIG. 5, and the plurality of first electrodes E1-1 to E1-5 and the sensing patterns SP2 may be formed by patterning the second conductive pattern layer IS-CL2. According to some embodiments, each of the first signal lines SL1 and the second signal lines SL2 may include a line pattern formed by patterning the first conductive pattern layer IS-CL1 and a line pattern formed by patterning the second conductive pattern layer IS-CL2. The details of this will be described later with reference to FIG. 7C.

In order to indicate the relative positions of insulating patterns DMP1 and DMP2 and a bank BNP with respect to the input sensor ISL, the insulating patterns DMP1 and DMP2 and the bank BNP provided on the display panel DP are additionally illustrated in FIG. 6A.

FIGS. 6B and 6C illustrate, as an example, signal lines including a plurality of portions located on different layers. Each of the signal lines SGL of the display panel DP and the signal lines SL1 and SL2 of the input sensor ISL may include a plurality of portions.

Referring to a data line DL illustrated in FIG. 6B, some of the signal lines SGL of the display panel DP may include first to fourth portions P1 to P4. The first to fourth portions P1 to P4 may be connected through contact holes CNT. Some of the first to fourth portions P1 to P4 may be located on different layers, and some of them may be located on a same layer.

Referring to FIG. 4 together, some of the first to fourth portions P1 to P4 may be located on the same layer as the gate G1, others may be located on the same layer as the first connection electrode CNE1, and the others may be located on the same layer as the second connection electrode CNE2.

The contact holes CNT penetrate at least one insulating layer located between two portions in order to connect the two corresponding portions among the first to fourth portions P1 to P4. The contact holes CNT may be formed in the same manner as one of the contact holes CNT-1 and CNT-2 illustrated as an example in FIG. 4.

Referring to FIGS. 6B and 6C, the first signal lines SL1 and the second signal lines SL2 including the first to third portions P10 to P30 are illustrated as an example. The first to third portions P10 to P30 may be connected through the contact holes CNT. The first to third portions P10 to P30 may be located on different layers. Each of the first portion P10 and the second portion P20 among the first to third portions P10 to P30 may be located on the same layer as a corresponding portion among the first to fourth portions P1 to P4 of the data line DL. For example, particularly, The first portion P1 and the second portion P20 overlapping the display region DP-DA may be located on the same layer as the second connection electrode CNE2, and the fourth portion P4 and the third portion P30 overlapping the second non-bending region DP-N2 may be located on the same layer as the gate G1.

Figure 7A:
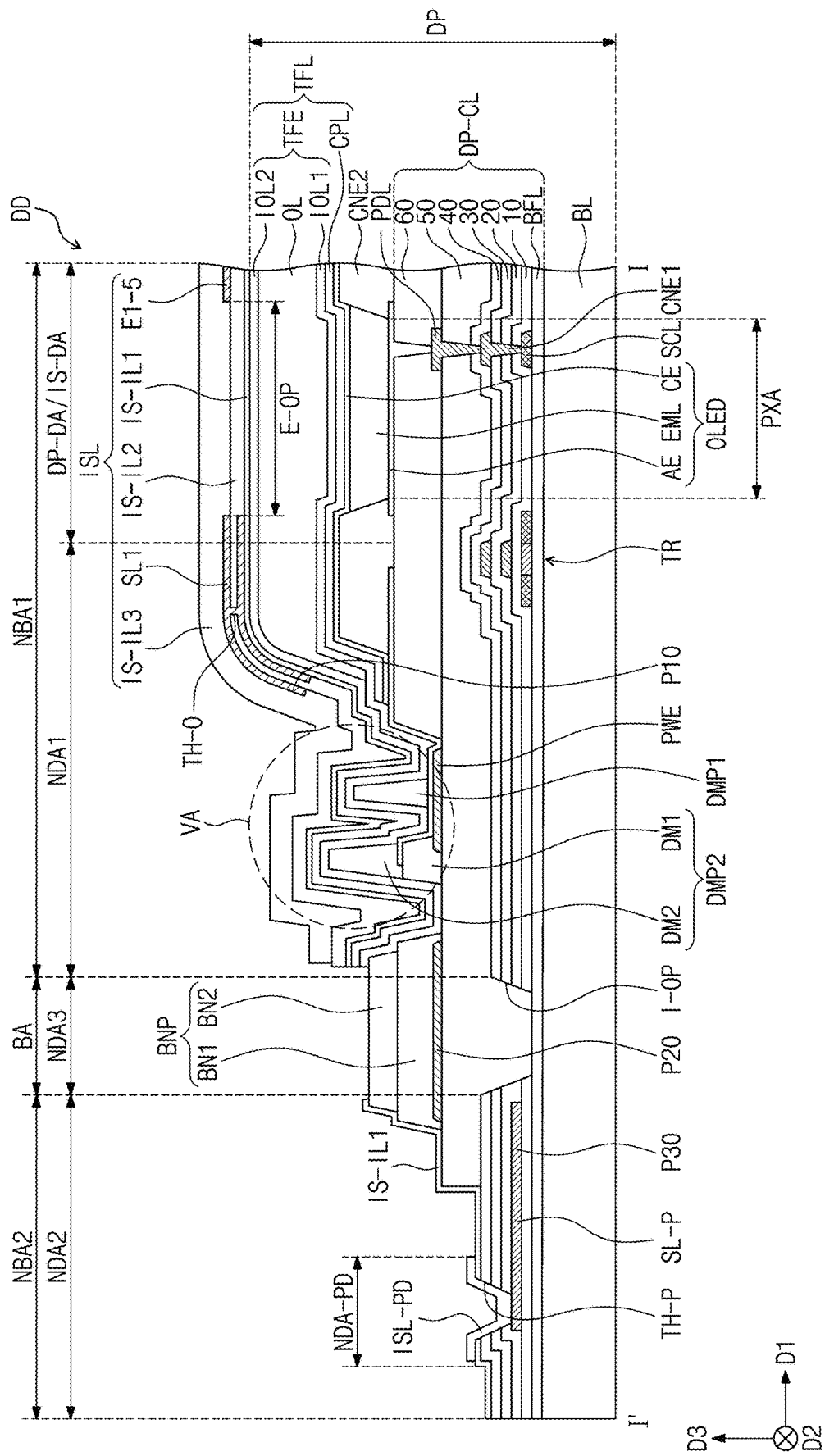
FIG. 7A is a cross-sectional view of a display device corresponding to the line I-I' of FIGS. 6A to 6C.
Figure 7B:
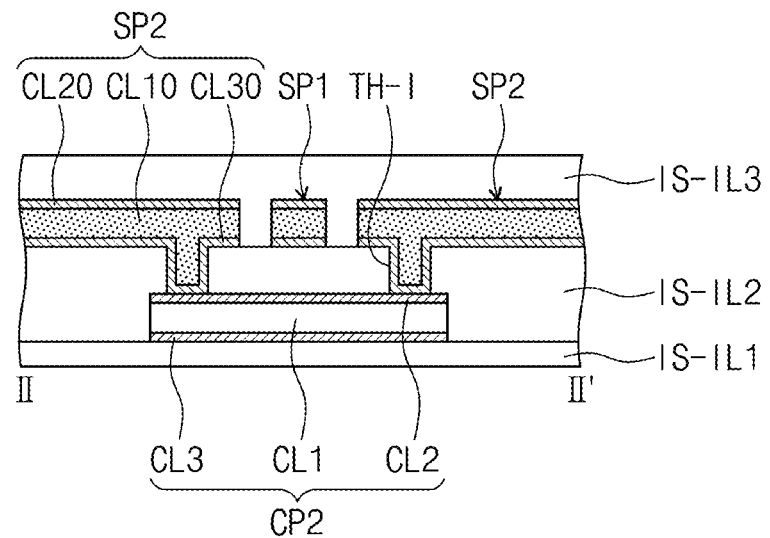
FIG. 7B is a cross-sectional view of a display device corresponding to the line II-II' of FIG. 6A.
Figure 7C:
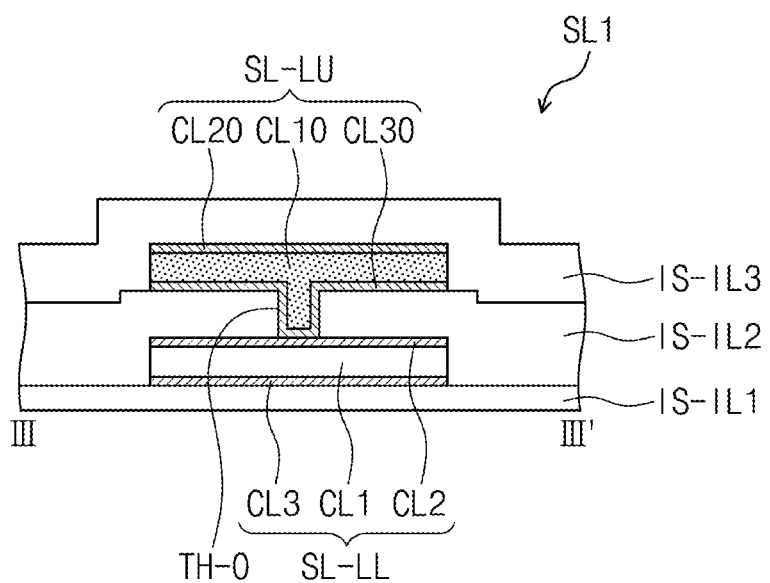
FIG. 7C is a cross-sectional view of a display device corresponding to the line III-III' of FIG. 6A.
Figure 7D:
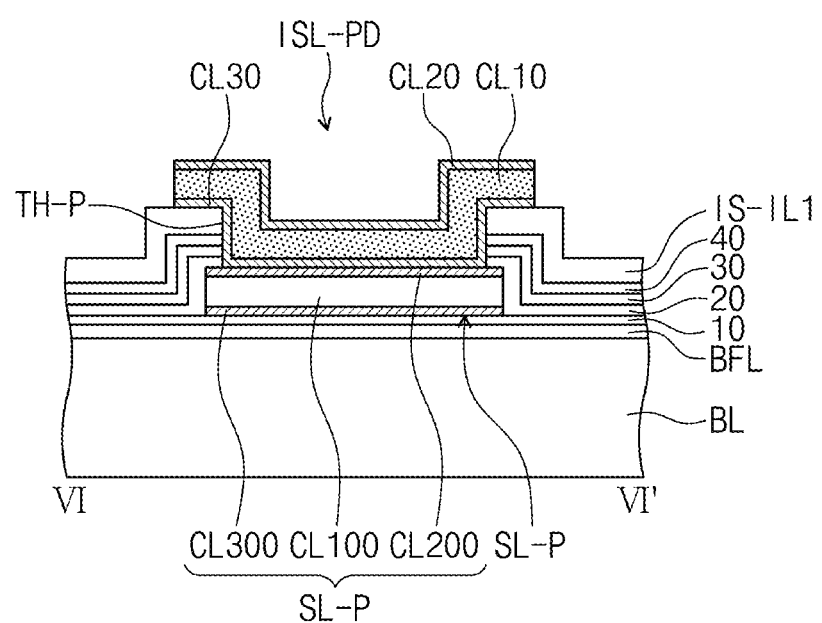
FIG. 7D is a cross-sectional view of a display device corresponding to the line IV-IV' of FIG. 6A.

FIG. 7A is a cross-sectional view of a display device DD corresponding to the line I-I' of FIGS. 6A to 6C. FIG. 7B is a cross-sectional view of a display device DD corresponding to the line II-II' of FIG. 6A. FIG. 7C is a cross-sectional view of a display device DD corresponding to the line III-III' of FIG. 6A. FIG. 7D is a cross-sectional view of a display device corresponding to the line IV-IV' of FIG. 6A. Hereinafter, FIGS. 6A to 6C will be referred to together and some detailed description of the same configuration may be omitted.

Because the stacked structures of a circuit element layer DP-CL, a display element layer DP-OLED, and an upper insulating layer TFL located in the display region DP-DA are the same as the configuration described with reference to FIG. 4, a detailed description will be omitted. According to some embodiments, a hole control layer HCL and an electronic control layer ECL may be included. Because the stacked structure of the input sensor ISL is also the same as the configuration described with reference to FIGS. 6A to 6C, a detailed description will be omitted. FIG. 7A illustrates, as an example, one opening E-OP defined in the first electrode E1-5 having a mesh shape.

As illustrated in FIG. 7A, a power electrode PWE providing a power voltage ELVSS may be located in the first non-display region NDA1. The power electrode PWE may be located on the fifth insulating layer 50. A connection electrode E-CNT is located on the sixth insulating layer 60. The connection electrode E-CNT connects the power electrode PWE and the second electrode CE. The connection electrode E-CNT is located on the same layer as the first electrode AE.

As illustrated in FIG. 7A, the first insulating pattern DMP1 and the second insulating pattern DMP2 may overlap the power electrode PWE. The first insulating pattern DMP1 may have a single-layered structure, and the second insulating pattern may have a multi-layered structure. The first insulating pattern DMP1 may be formed through the same process as the pixel defining film PDL. A lower portion DM1 of the second insulating pattern DMP2 may be formed through the same process as the sixth insulating layer 60, and an upper portion DM2 thereof may be formed through the same process as the pixel defining film PDL.

A valley region VA is defined between the first insulating pattern DMP1 and the second insulating pattern DMP2. In the valley region VA, the first inorganic layer IOL1, the second inorganic layer IOL2, the base insulating layer IS-IL1, the intermediate insulating layer IS-IL2, and the protective insulating layer IS-IL3 may be located on the first insulating pattern DMP1 and the second insulating pattern DMP2. Referring to the line I-I' of FIGS. 6A to 6C, FIG. 7A illustrates a cross section of the valley region VA in which the first portion P10 is not located. Referring to FIG. 6C, on a plane, the first portions P10 of the first signal lines SL1 may be arranged to be spaced apart along the second direction DR2 so as to overlap the valley region VA.

The inorganic layer may not be located in the bending region BA. An opening I-OP may be defined in the first to fourth insulating layers 10 to 40 which are inorganic layers in the bending region BA. The opening I-OP may extend to the buffer layer BFL. After the first to fourth insulating layers 10 to 40 are stacked, the opening I-OP may be formed through an etching process. A portion of the fifth insulating layer 50 is located inside the opening I-OP.

The inorganic layers may be stacked in the second non-bending region NBA2. Particularly, the first to fourth insulating layers 10 to 40 and the base insulating layer IS-IL1 may be located in a pad region NDA-PD.

A pad portion SL-P of the first signal lines SL1 and a pad electrode ISL-PD connected to the pad portion SL-P are located in the pad region NDA-PD. FIG. 7A briefly illustrates the third portion P30 connected to the pad portion SL-P, the second portion P20 located on a layer different from that of the third portion P30, and the first portion P10 located on a layer different from that of the third portion P30 and the second portion P20.

The pad portion SL-P and the third portion P30 are located on the same layer and have an integral shape. The second portion P20 may be located on the fifth insulating layer 50. The second portion P20 may be located on the same layer as the second connection electrode CNE2. According to some embodiments, corresponding portions among the first portion P10, the second portion P20, and the third portion P30 may be connected through the above-described contact hole CNT.

A bank BNP may have a multi-layered structure of an organic layer. The lower portion BN1 may be formed through the same process as the sixth insulating layer 60, and the upper portion BN2 may be formed through the same process as the pixel defining film PDL.

The display device DD will be described in more detail with reference to FIGS. 7B to 7D.

Referring to FIGS. 7B and 7C, a lower line pattern SL-LL and a bridge pattern CP2 formed from the first conductive pattern layer IS-CL1 illustrated in FIG. 5 are located on the base insulating layer IS-IL1. As briefly described with reference to FIGS. 6A to 6C, the first signal lines SL1 and the second signal lines SL2 may include line patterns located on different layers, and the connection structure of the line patterns is illustrated in FIG. 7C.

The line patterns located on different layers do not need to be equally arranged from one end to the other end of each of the first and second signal lines SL1 and SL2. The third portion P30 illustrated in FIG. 6C may include the lower line pattern SL-LL and an upper line pattern SL-LU. Of course, according to some embodiments of the inventive concept, one of the lower line pattern SL-LL and the upper line pattern SL-LU, for example, the lower line pattern SL-LL may be omitted.

The bridge pattern CP2 and the lower line pattern SL-LL have the same stacked structure. Hereinafter, a stacked structure will be described, centering on the bridge pattern CP2. The bridge pattern CP2 may have a multi-layered structure. The bridge pattern CP2 may include a first conductive layer CL1 having a relatively high conductivity, a second conductive layer CL2 located above the first conductive layer CL1, and a third conductive layer CL3 located below the first conductive layer CL1. The third conductive layer CL3 may have a greater bonding strength to the base insulating layer IS-IL1 than the first conductive layer CL1, and the second conductive layer CL2 may have a smaller external light reflectance than the first conductive layer CL1. The second conductive layer CL2 and the third conductive layer CL3 may contain the same material. The first conductive layer may be aluminum, and the second conductive layer CL2 and the third conductive layer CL3 may be titanium. Although a portion of the first conductive layer CL1, the second conductive layer CL2, and the third conductive layer CL3 contain different materials, the first conductive layer CL1, the second conductive layer CL2, and the third conductive layer CL3 may contain a material that can be etched with the same type of etching solution. Aluminum and titanium may be etched with a fluorinated etching solution. Accordingly, stacked titanium, aluminum, and titanium layers of the first conductive layer CL1 may be patterned by one etching process.

The intermediate insulating layer IS-IL2 is located on the base insulating layer IS-IL1 and covers the bridge pattern CP2 and the lower line pattern SL-LL. In the intermediate insulating layer IS-IL2, an inner contact hole TH-I exposing the bridge pattern CP2 and an outer contact hole TH-O exposing the lower line pattern SL-LL are defined. The inner contact hole TH-I and the outer contact hole TH-O may be formed by a same organic-layer etching process. Referring to FIG. 6A, the inner contact holes TH-I may be arranged at each intersection region of the first electrodes E1-1 to E1-5 and the second electrodes E2-1 to E2-4, and the outer contact holes TH-O may be arranged at an interval (e.g., a set or predetermined interval).

Sensing patterns SP2 respectively connected to the bridge pattern CP2 through the inner contact hole TH-I are located on the intermediate insulating layer IS-IL2. The upper line pattern SL-LU connected to the lower line pattern SL-LL through the outer contact hole TH-O is located on the intermediate insulating layer IS-IL2.

The sensing patterns SP2 and the upper line pattern SL-LU have the same stacked structure. A first sensing portion SP1 is also formed through the same process as the sensing patterns SP2. The protective insulating layer IS-IL3 is located on the intermediate insulating layer IS-IL2 and covers the sensing patterns SP2 and the upper line pattern SL-LU. FIG. 7B illustrates one sensing portion SP1 between two sensing patterns SP2, but this is just for convenience of explanation, and a plurality of sensing portions SP1 may be located between two sensing patterns SP2.

Hereinafter, a stacked structure will be described, centering on the upper line pattern SL-LU. The upper line pattern SL-LU may have a stacked structure different from that of the bridge pattern CP2. The upper line pattern SL-LU may include a first conductive layer CL10, a second conductive layer CL20 located above and in contact with the first conductive layer CL10, and a third conductive layer CL30 located below and in contact with the first conductive layer CL10. According to some embodiments of the inventive concept, the third conductive layer CL30 may be omitted.

The first conductive layer CL10 has a first reflectance, a first conductivity, and a first thickness. The second conductive layer CL20 has a second reflectance lower than the first reflectance, a second conductivity lower than the first conductivity, and a second thickness smaller than the first thickness. The first conductive layer CL10 having the lower resistance corresponds to a substantial signal transfer path. By increasing thickness, a plurality of signal lines SL1 and SL2 may be located within a narrow area on a plane. The second conductive layer CL20 having the lower reflectance covers the first conductive layer CL10 to lower the reflectance of external light.

The third conductive layer CL30 may have a greater bonding strength to the base insulating layer IS-IL1 than the first conductive layer CL10. The first conductive layer CL10 may contain copper having a low resistance. The third conductive layer CL30 may contain zinc indium oxide (ZIO), indium oxide (InO), zinc oxide (ZnO), or an alloy of a metal constituting the first conductive layer CL10, for example, a copper alloy. The content of indium oxide in the third conductive layer CL30 that is a ZIO layer may be about 30% or less of the entire third conductive layer CL30, which means that the content of indium oxide may be lower than that of general IZO.

The second conductive layer C120 may contain titanium. The titanium layer may have a thickness of about 100 Å to about 500 Å. By applying the second conductive layer CL20 of titanium as an uppermost conductive layer, the reflectance of external light is reduced, and unlike the reflected light of the uppermost conductive layer of copper being shifted to red, the reflected light of the titanium layer causes a relatively small color shift to occur.

For process reasons to be described later, materials for the first conductive layer CL10 and the third conductive layer CL30 are selected from the materials that cannot be etched by an etching solution capable of etching the second conductive layer CL20. The first conductive layer CL10 and the third conductive layer CL30 contain a material having etching properties different from those of the second conductive layer CL20.

The materials of the first conductive layer CL10 and the third conductive layer CL30 can be etched with the same type of etching solution. In order to simultaneously (or concurrently) etch the first conductive layer CL10 and the third conductive layer CL30 with a non-fluorinated etching solution, a transparent conductive oxide including tin (Sn) among transparent conductive oxides is excluded from the materials constituting the third conductive layer CL30. This is because tin (Sn) has a low etching rate for a non-fluorinated etching solution.

Referring to FIG. 7D, a pad portion SL-P is located on the first insulating layer 10. The pad portion SL-P may include a first conductive layer CL100 having a relatively high conductivity, a second conductive layer CL200 located above the first conductive layer CL100, and a third conductive layer CL300 located below the first conductive layer CL100. A stacked structure of the pad portion SL-P is not particularly limited.

A pad electrode ISL-PD is connected to the pad portion SL-P through the pad contact hole TH-P penetrating the second to fourth insulating layers 20 to 40 and the base insulating layer IS-IL1. The pad electrode ISL-PD may have the same stacked structure as the upper line pattern SL-LU described above.

Referring to FIG. 6A, according to some embodiments, the distance between adjacent pad electrodes ISL-PD in the second direction DR2 may be greater than the width of the pad electrodes ISL-PD. In FIG. 7D, the pad electrode ISL-PD is illustrated as a rectangle in cross section, but as a process issue, a tip may occur in the second conductive layer CL20. In order to prevent or reduce instances of a short circuit between the pad electrodes ISL-PD by such a tip, some embodiments may secure a sufficient space between the adjacent pad electrodes ISL-PD.

FIGS. 8A to 8G are cross-sectional views illustrating a method for fabricating an input sensor ISL according to some embodiments of the inventive concept. FIG. 9 shows photographs about a swelling phenomenon occurring in a line portion SL-L of an input sensor ISL. Each of FIGS. 8A to 8G illustrates various steps or processing operations of the method of fabrication on the basis of a cross section of FIGS. 7B to 7C and a cross section of the valley region VA of FIG. 7A. Hereinafter, some detailed description of the same configuration as that described with reference to FIGS. 7A to 7D may be omitted.

A method of fabricating the input sensor ISL according to some embodiments of the inventive concept includes forming a bridge pattern CP2 on a base insulating layer IS-IL1 so as to overlap at least a sensing region IS-DA, forming an intermediate insulating layer IS-IL2 on the base insulating layer IS-IL1, forming a contact hole TH-I exposing the bridge pattern CP2 on the intermediate insulating layer IS-IL2, and forming a sensing pattern SP2 connected to the bridge pattern CP2 through the contact hole TH-I on the intermediate insulating layer IS-IL2. Hereinafter, a more detailed description will be given with reference to FIGS. 8A to 8H.

Figure 8A:
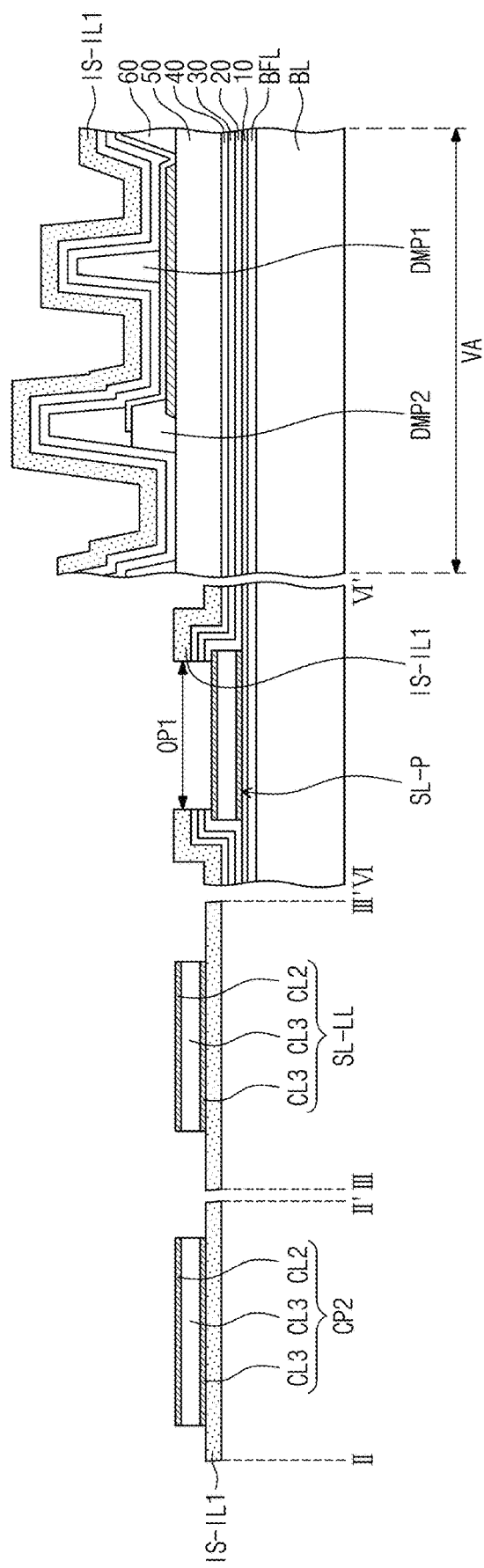
FIGS. 8A to 8G are cross-sectional views illustrating a method for fabricating an input sensor according to some embodiments of the inventive concept.
Figure 9:
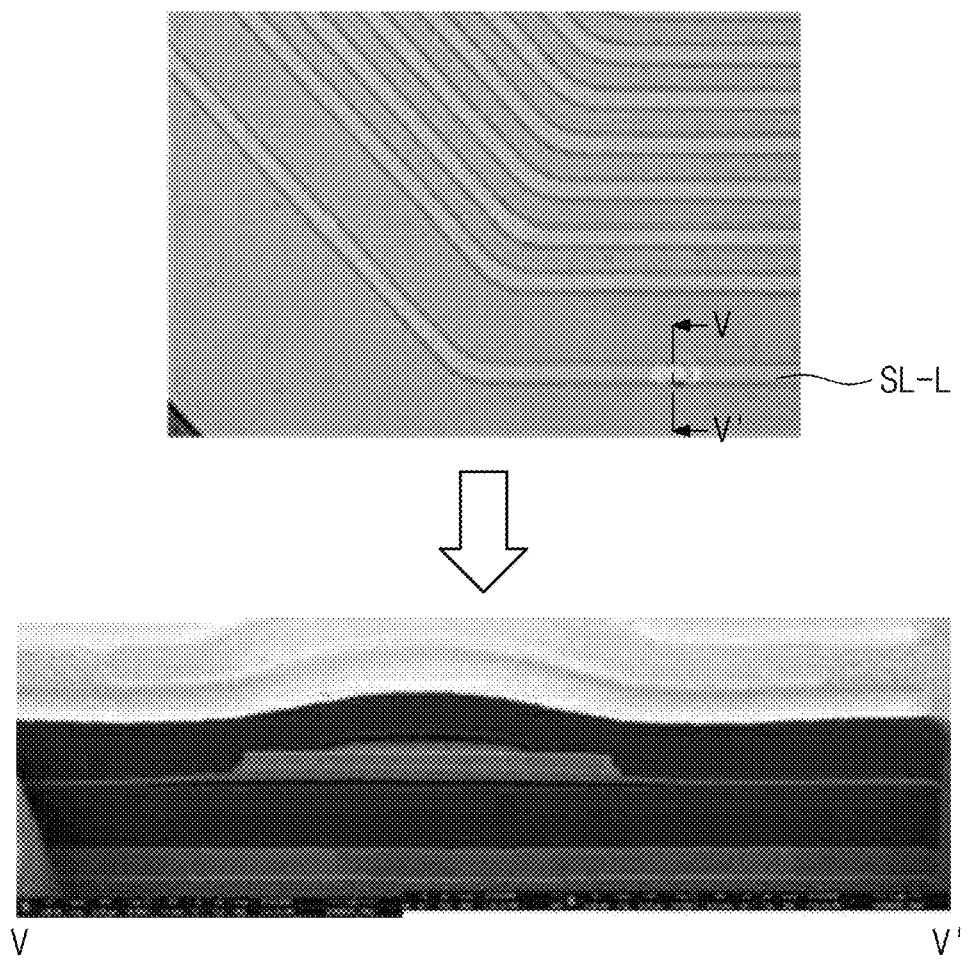
FIG. 9 shows photographs about a swelling phenomenon occurring in a signal line of an input sensor.

As illustrated in FIG. 8A, the bridge pattern CP2 and a lower line pattern SL-LL are formed on the base insulating layer IS-IL1. A first preliminary conductive layer, a second preliminary conductive layer, and a third preliminary conductive layer are sequentially formed on the base insulating layer IS-IL1. The first preliminary conductive layer, the second preliminary conductive layer, and the third preliminary conductive layer may contain titanium, aluminum, and titanium, respectively. By forming the first preliminary conductive layer, the second preliminary conductive layer, and the third preliminary conductive layer with materials having similar etching properties, the stacked structure of the preliminary conductive layers may be patterned through one wet-etching process. As a result of the patterning, the bridge pattern CP2 and the lower line pattern SL-LL including the first conductive layer CL1, the second conductive layer CL2, and the third conductive layer CL3 are formed.

As illustrated in FIG. 8A, a first opening OP1 may be formed in the base insulating layer IS-IL1. The first opening OP1 may be formed through a photolithography process and an etching process before or after the etching process of the stacked structure of the preliminary conductive layer. The first opening OP1 corresponds to an opening formed in the lower insulating layer. Therefore, a portion of the pad portion SL-P may be exposed to the outside.

Figure 8B:
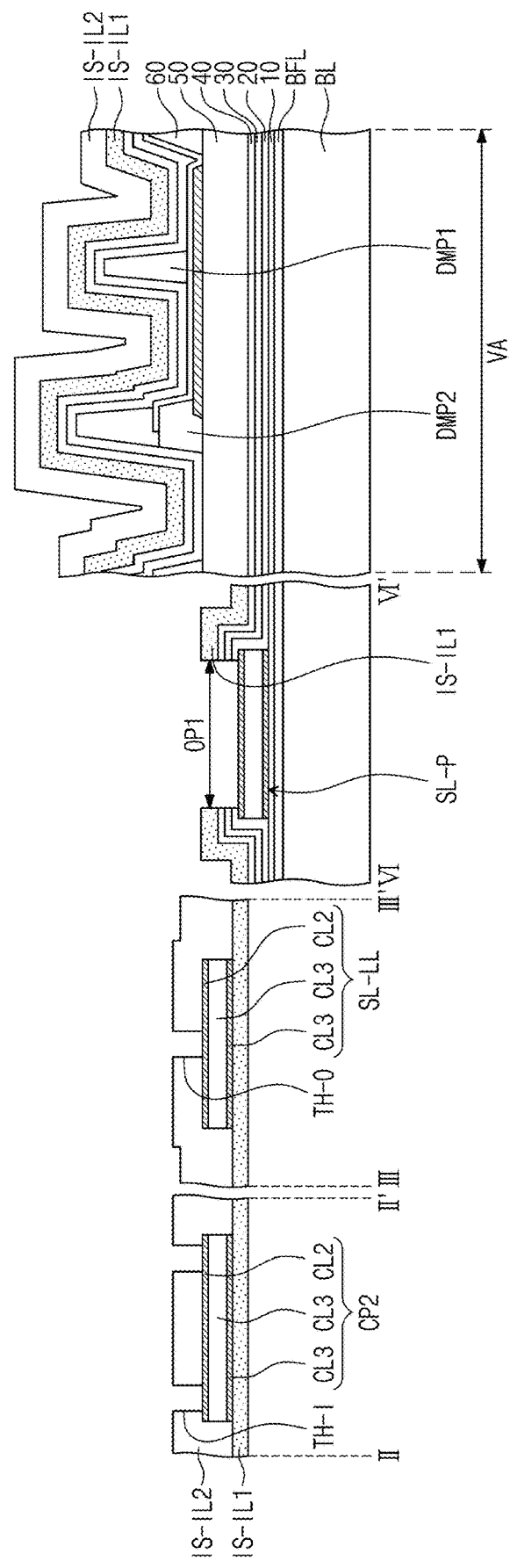

Next, as illustrated in FIG. 8B, the intermediate insulating layer IS-IL2 covering the bridge pattern CP2 and the lower line pattern SL-LL on the base insulating layer IS-IL1 are formed. The intermediate insulating layer IS-IL2 may be formed through an organic material deposition process or an inkjet process. In a same process, an inner contact hole TH-I exposing the bridge pattern CP2 and an outer contact hole TH-O exposing the lower line pattern SL-LL may be formed.

The intermediate insulating layer IS-IL2 is not located in the non-bending region DP-N2 illustrated in FIG. 6B. An organic material may not be deposited in the non-bending region DP-N2 by using a mask, or a portion of the intermediate insulating layer IS-IL2 formed in the non-bending region DP-N2 in the process of forming the second opening OP2 described above may be removed.

Next, as described in FIGS. 8C to 8G, the sensing pattern SP2 is formed on the intermediate insulating layer IS-IL2. An upper line pattern SL-LU may be formed with the sensing pattern SP2 at the same time. A sensing portion SP1 may be formed with the sensing pattern SP2 at the same time.

Figure 8C:
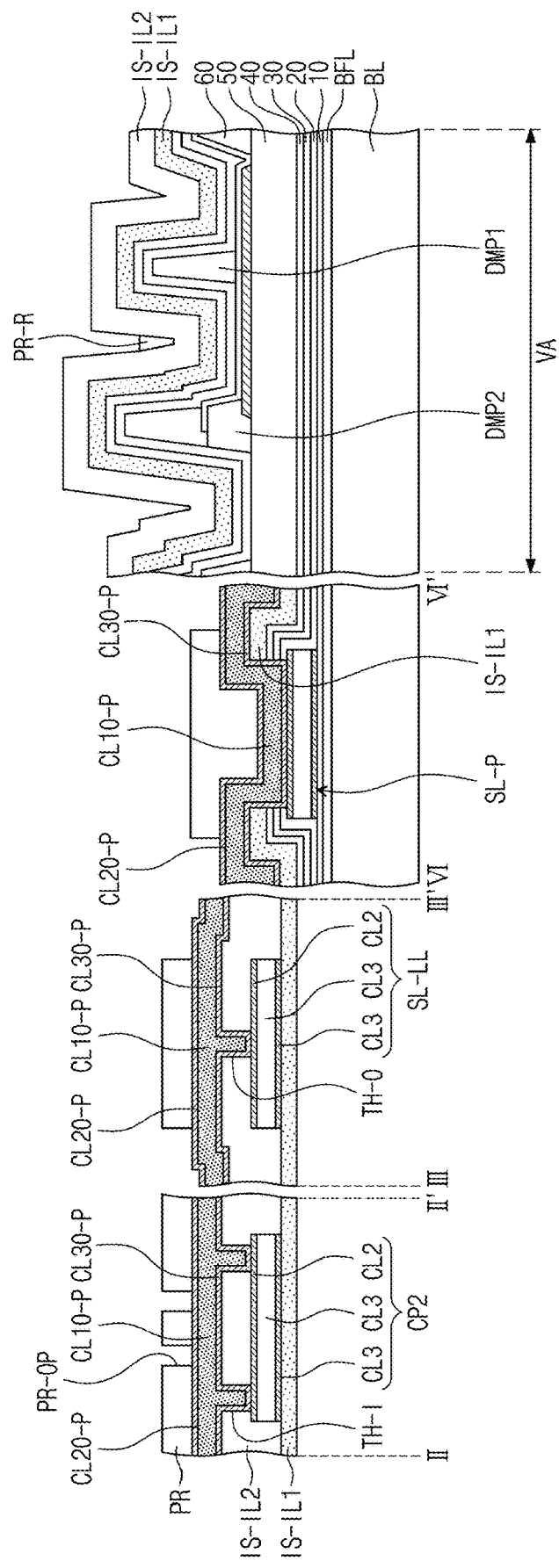

As illustrated in FIG. 8C, a third preliminary conductive layer CL30-P, a first preliminary conductive layer CL10-P, and a second preliminary conductive layer CL20-P are sequentially formed on the intermediate insulating layer IS-IL2. A first type of conductive material, a second type of conductive material, and a third type of conductive material may be sequentially deposited or sputtered to form a stacked structure of the preliminary conductive layer. According to some embodiments of the inventive concept, the third preliminary conductive layer CL30-P may be non-formed.

As illustrated in FIG. 8C, a photoresist pattern PR is formed on the second preliminary conductive layer CL20-P. After a photoresist layer is formed, the photoresist layer is patterned through a photolithography process and an etching process. Because the photoresist pattern PR serves as a mask, the photoresist pattern PR is patterned in consideration of a conductive pattern to be formed from the third preliminary conductive layer CL30-P. The third preliminary conductive layer CL30-P is exposed from the region from which the photoresist layer is removed.

As illustrated in FIG. 8C, an opening PR-OP may be formed on the bridge pattern CP2. Most of the photoresist layer is removed in the valley region VA. A photoresist residue PR-R remaining in the valley area VA is illustrated as an example. If exposure amount is sufficiently increased, the photoresist residue PR-R may not remain.

Figure 8D:
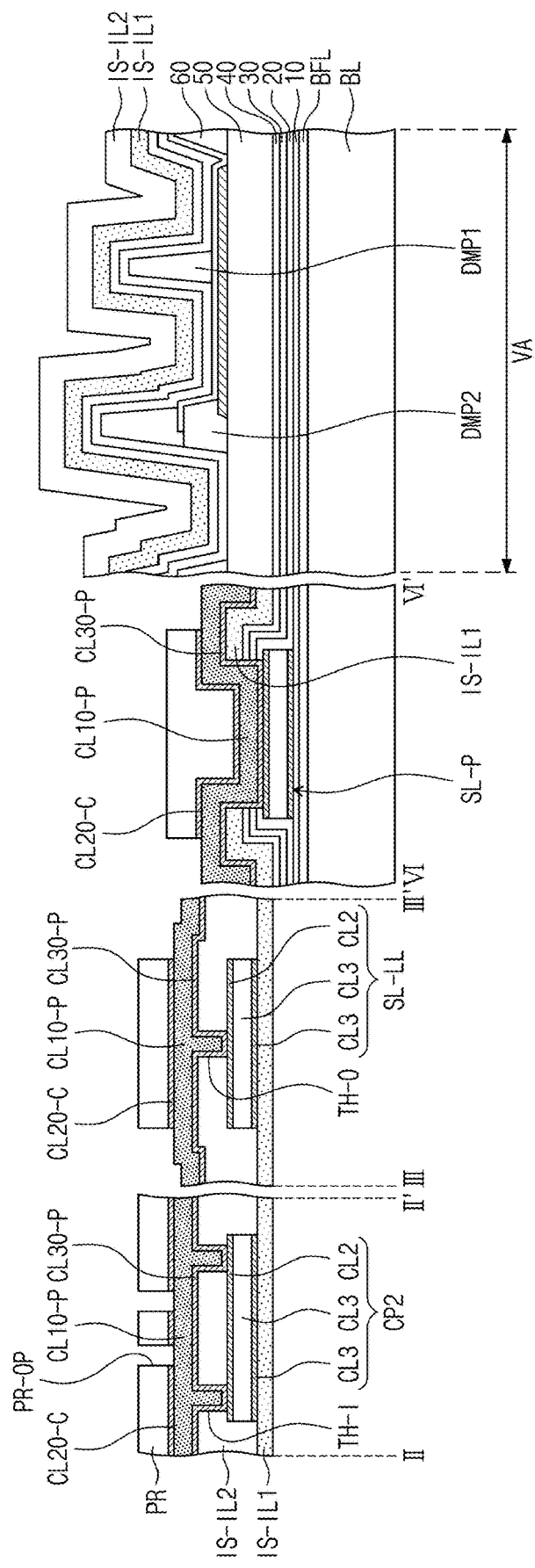

As illustrated in FIG. 8D, the second preliminary conductive layer CL20-P exposed from the photoresist pattern PR is dry-etched to form a second conductive pattern CL20-C. In this case, the photoresist residue PR-R in the valley region VA may be removed together with the second preliminary conductive layer CL20-P. Because the photoresist residue PR-R in the processing operation of FIG. 8D may be removed accessorily in this step, the photoresist layer may not be over-exposed in the processing operation of FIG. 8C.

Meanwhile, if the residue of the photoresist layer is not removed, defects occur. A short-circuit defect may occur when patterns to be separated among the second conductive patterns CL20-C are connected to each other. For example, in the valley region VA, adjacent first portions P10 among the first portions P10 illustrated in FIG. 6C are short-circuited.

Figure 8E:
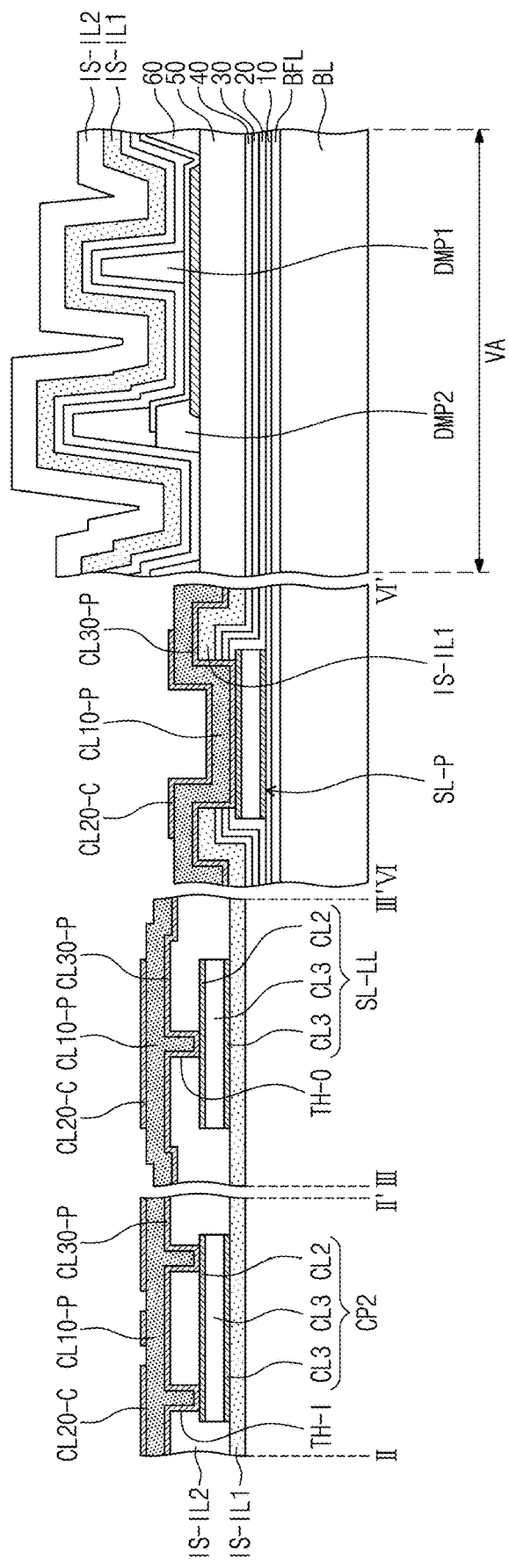

Thereafter, as illustrated in FIG. 8E, the photoresist pattern PR is removed. An Asher or stripper is used to remove the photoresist pattern PR.

FIG. 9 illustrates a defect in which swelling occurs in an organic layer (which may correspond to the intermediate insulating layer IS-IL2 of FIG. 8E) in the process of removing the photoresist pattern PR. An Asher solution permeates, causing swelling to the intermediate insulating layer IS-IL2, which is an organic layer. As illustrated in FIG. 8E, when the second conductive pattern CL20-C and the first preliminary conductive layer CL10-P sufficiently protect the intermediate insulating layer IS-IL2, which is an organic layer, from the Asher solution, a defect as shown in FIG. 9 will not occur. Unlike embodiments according to the present invention, when both the second preliminary conductive layer CL20-P and the first preliminary conductive layer CL10-P are patterned before the photoresist pattern PR is removed, the above-described defect may occur in the intermediate insulating layer IS-IL2 exposed to the outside.

Figure 8F:
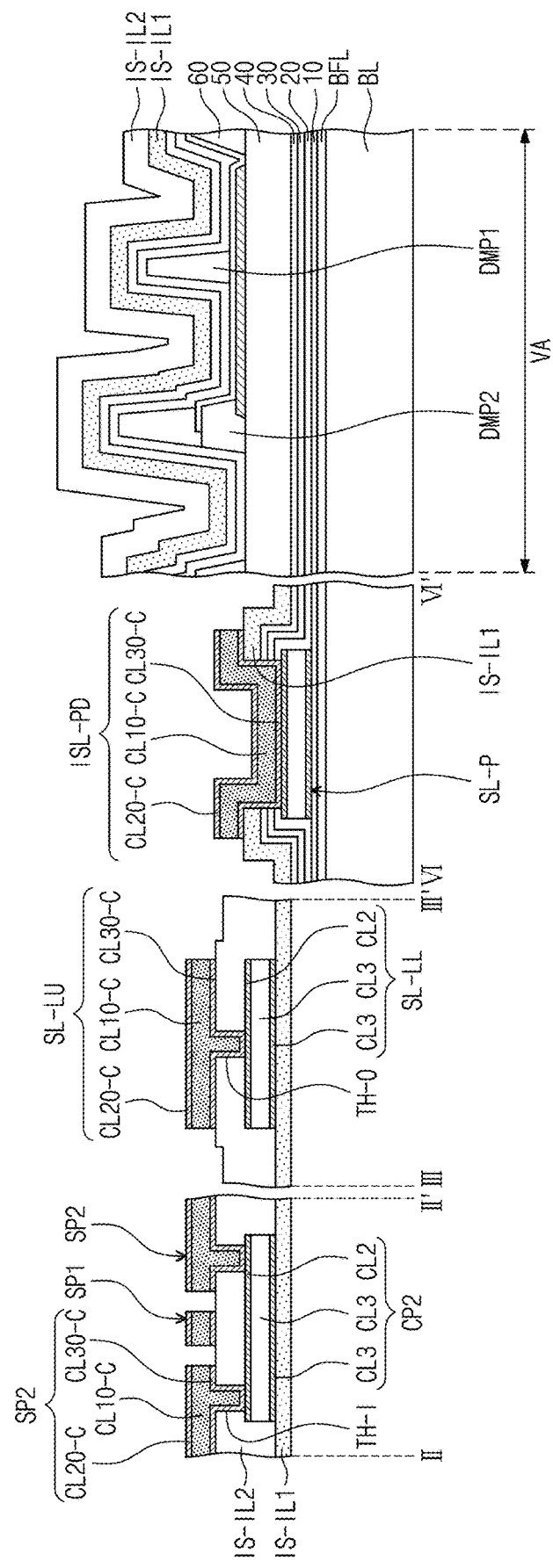

Thereafter, as illustrated in FIG. 8F, the first preliminary conductive layer CL10-P exposed from the second conductive pattern CL20-C is wet-etched to form a first conductive pattern CL10-C overlapping the second conductive pattern CL20-C. In the wet-etching process, the second conductive pattern CL20-C serves as a mask. A solution which etches only the first conductive pattern CL10-C without etching the second conductive pattern CL20-C may be selected as an etching solution. When the second conductive pattern CL20-C contains titanium and the first preliminary conductive layer CL10-P contains copper, a non-fluorinated etching solution may be used for a wet-etching process.

Referring to FIG. 8F, after the wet-etching, the first conductive pattern CL10-C and the second conductive pattern CL20-C are illustrated to be aligned on a cross section.

For process reasons, however, a tip proportional to a skew may occur in the titanium layer located on the copper layer. This tip may have a length of about 0.5 to about 1.5 times the thickness of the copper layer.

In the processing operation in which the first preliminary conductive layer CL10-P is etched, the third preliminary conductive layer CL30-P may be patterned at the same time. A third conductive pattern CL30-C may be formed from a region overlapping the first conductive pattern CL10-C of the third preliminary conductive layer CL30-P. When the first preliminary conductive layer CL10-P contains copper, the third preliminary conductive layer CL30-P may contain indium zinc oxide (IZO), indium oxide (InO), Zinc Oxide (ZnO), or a copper alloy that can be etched with a non-fluorinated etching solution. The copper alloy may contain a small amount of aluminum in addition to copper.

As a result, a sensing pattern SP2, a sensing portion SP1, an upper line pattern SL-LU, and a pad electrode ISL-PD including the stacked structures of the first to third conductive patterns CL10-C to CL30-C are formed. In addition, all of the first to third preliminary conductive layers may be removed from a region designed not to form a conductive pattern in the valley region VA.

Figure 8G:
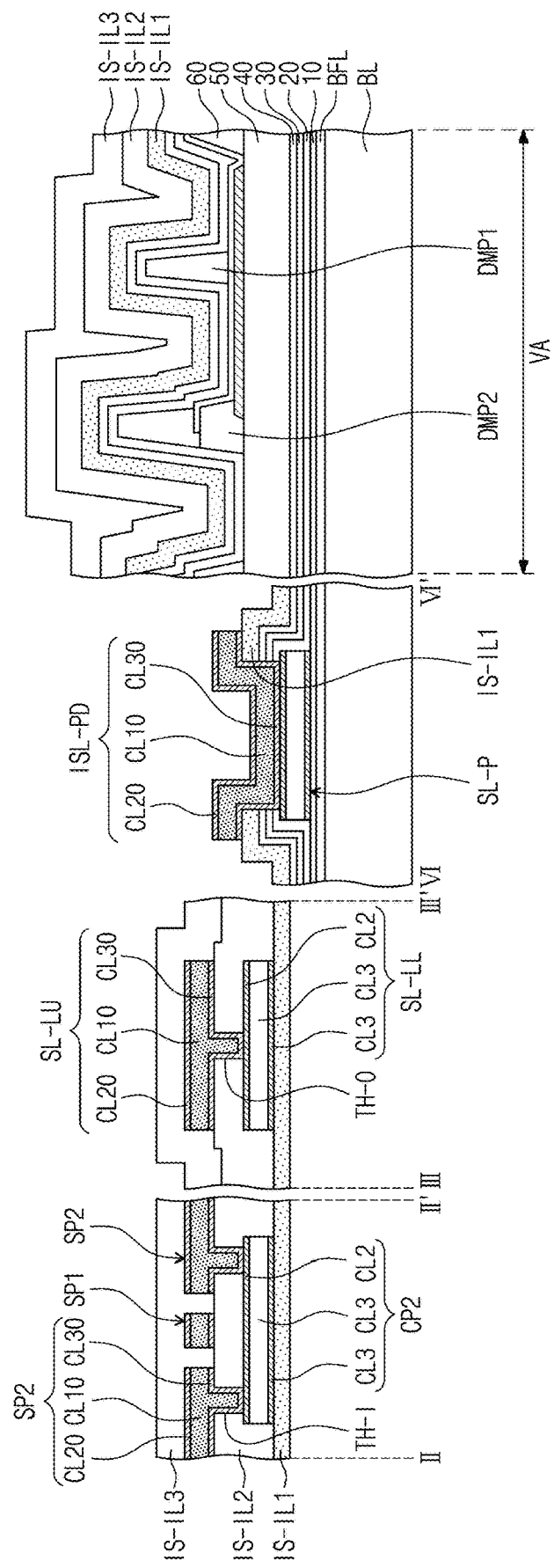

Thereafter, as illustrated in FIG. 8G, a protective insulating layer IS-IL3 is formed on the intermediate insulating layer IS-IL2. The protective insulating layer IS-IL3 may be formed on at least a partial region through an organic material deposition process or an inkjet process. After the protective insulating layer IS-IL3 is formed entirely on the intermediate insulating layer IS-IL2, the protective insulating layer IS-IL3 may be patterned through a photolithography process and an etching process. In FIG. 8G, the first to third conductive patterns CL10-C to CL30-C of FIG. 8F are illustrated as the first to third conductive layers CL10 to CL30.

According to the above description, RC delay of a transmission signal and a received signal may be relatively reduced. This is because the resistance of a signal line is relatively low. The reflectance of external light may be relatively decreased and the color shift of reflected light may be relatively reduced.

Swelling defects on an organic layer may be relatively reduced. This is because the organic layer is not exposed to a dry-etching process.

Short-circuit defects on the signal line may be relatively reduced. This is because the photoresist residue located in the valley region may be removed in the dry-etching process of the second conductive layer. Therefore, the first conductive layer below the second conductive layer may be patterned to correspond to a plurality of signal lines.

Although the above has been described with reference to some embodiments of the present invention, those skilled in the art or those of ordinary skill in the art will understand that the present invention may be variously modified and changed within the scope not departing from the spirit and technical scope of the present invention described in the claims to be described later.

Therefore, the technical scope of embodiments according to the present invention should not be limited to the contents described in the detailed description of the specification, but should be determined by the claims, and their equivalents, below.

What is claimed is:
1. A display device comprising:
a display panel; and
an input sensor on the display panel and including a sensing region and a non-sensing region adjacent to the sensing region,
wherein the input sensor comprises:
a base insulating layer;
a sensing electrode on the base insulating layer and overlapping the sensing region; and
a signal line electrically connected to the sensing electrode and overlapping the non-sensing region,
wherein the signal line comprises:
a first conductive layer on the base insulating layer and having a first reflectance, a first conductivity, and a first thickness;
a second conductive layer having a second reflectance lower than the first reflectance, a second conductivity lower than the first conductivity, and a second thickness smaller than the first thickness, wherein the second conductive layer is on and in contact with the first conductive layer; and
a third conductive layer between the base insulating layer and the first conductive layer, in contact with each of the base insulating layer and the first conductive layer, wherein the third conductive layer contains a material different from that of the second conductive layer.

2. The display device of claim 1, wherein:
the sensing electrode comprises a first sensing electrode and a second sensing electrode, which are insulated from and crossing each other in a plan view; and
the signal line comprises a first signal line connected to the first sensing electrode and a second signal line connected to the second sensing electrode,
wherein the first sensing electrode has an integral shape,
the second sensing electrode comprises a sensing pattern on a same layer as the first sensing electrode and a bridge pattern on a layer different from that of the sensing pattern, and
the input sensor further comprises an organic layer overlapping the sensing region, the bridge pattern is below the organic layer, the sensing pattern is above the organic layer, and the bridge pattern is connected to the sensing pattern through a contact hole penetrating the organic layer.

3. The display device of claim 2, wherein the first sensing electrode has a same stacked structure as the signal line.

4. The display device of claim 3, wherein the bridge pattern has a stacked structure different from that of the signal line.

5. The display device of claim 1, wherein a bonding strength of the third conductive layer to the base insulating layer is greater than a bonding strength of the first conductive layer to the base insulating layer.

6. The display device of claim 1, wherein the first conductive layer comprises copper and the third conductive layer comprises Indium Zinc Oxide (IZO), Indium Oxide (InO), Zinc Oxide (ZnO), or a copper alloy.

7. The display device of claim 6, wherein the second conductive layer comprises titanium.

8. The display device of claim 1, wherein the display panel comprises:
a base layer comprising a display region corresponding to the sensing region and a non-display region corresponding to the non-sensing region;
a transistor on the base layer and overlapping the display region;
a display element overlapping the display region and electrically connected to the transistor; and
a thin-film encapsulation layer on the display element, wherein an adhesive layer is not between the thin-film encapsulation layer and the base insulating layer.

9. A display device comprising:
a display panel comprising a first region including a display region and a non-display region, a second region extending from the first region and bent, and a third region extending from the second region and below the first region; and
an input sensor on the display panel,
wherein the input sensor comprises:
a sensing electrode overlapping the display region; and
a signal line electrically connected to the sensing electrode and overlapping the first region, the second region, and the third region,
wherein the signal line comprises:
a first portion overlapping the first region; and
a second portion overlapping the second region, connected to the first portion, and on a layer different from that of the first portion,
wherein the first portion comprises:
a first conductive layer containing copper; and
a second conductive layer having a lower reflectance than the first conductive layer, on the first conductive layer, and in contact with the first conductive layer
wherein the second portion has a stacked structure different from a stacked structure of the first portion.

10. The display device of claim 9, wherein the first portion further comprises a third conductive layer below and in contact with the first conductive layer,
wherein the third conductive layer comprises Indium Zinc Oxide (IZO), Indium Oxide (InO), Zinc Oxide (ZnO), or a copper alloy.

11. The display device of claim 9, wherein the sensing electrode has a same stacked structure as the first portion.

12. The display device of claim 9, wherein the display panel comprises:
a display element on the display region;
a transistor on the display region and electrically connected to the display element; and
a data line electrically connected to the transistor and overlapping at least the first region,
wherein the second portion and the data line have a same stacked structure.

13. The display device of claim 12, wherein:
the signal line further comprises a third portion overlapping the third region, connected to the second portion, and on a layer different from that of the second portion; and
the transistor comprises:
a semiconductor pattern including a first region having a first doping concentration and a second region having a second doping concentration higher than the first doping concentration; and
a gate overlapping the first region,
wherein the third portion has a same stacked structure as the gate.

14. The display device of claim 9, wherein the signal line further comprises a third portion overlapping the third region, connected to the second portion, and on a layer different from that of the second portion.

* * * * *